United States Patent [19]

Momosaki et al.

[11] 4,320,320

[45] Mar. 16, 1982

[54] COUPLED MODE TUNING FORK TYPE QUARTZ CRYSTAL VIBRATOR

[75] Inventors: Eishi Momosaki; Shigeru Kogure; Minoru Inoue, all of Suwa, Japan

[73] Assignee: Kabushiki Kaisha Suwa Seikosha, Tokyo, Japan

[21] Appl. No.: 42,732

[22] Filed: May 29, 1979

[30] Foreign Application Priority Data

Dec. 1, 1978 [JP] Japan .................. 53-149499
Dec. 1, 1978 [JP] Japan .................. 53-149500
Dec. 4, 1978 [JP] Japan .................. 53-150182
Dec. 4, 1978 [JP] Japan .................. 53-150183
Dec. 4, 1978 [JP] Japan .................. 53-150186

[51] Int. Cl.³ ........................... H01L 41/08
[52] U.S. Cl. .................... 310/361; 310/312; 310/370
[58] Field of Search .............. 310/312, 360, 361, 370, 310/333, 367, 368, 315, 346

[56] References Cited

U.S. PATENT DOCUMENTS

| | | | |
|---|---|---|---|
| 3,128,397 | 4/1964 | Shinada et al. | 310/361 |
| 3,423,609 | 1/1969 | Hammond | 310/361 |
| 3,691,411 | 9/1972 | Fedorkov et al. | 310/361 |
| 3,826,931 | 7/1974 | Hammond | 310/315 X |
| 3,969,641 | 7/1976 | Oguchi et al. | 310/370 X |
| 4,035,674 | 7/1977 | Oguchi et al. | 310/361 X |
| 4,050,126 | 9/1977 | Ikeno et al. | 310/312 X |
| 4,071,797 | 1/1978 | Zumsteg et al. | 310/361 |
| 4,076,987 | 2/1978 | Zumsteg | 310/361 |
| 4,099,078 | 7/1978 | Shibata et al. | 310/361 |
| 4,126,802 | 11/1978 | Hermann | 310/361 |
| 4,160,183 | 7/1979 | Kusters | 310/315 |

FOREIGN PATENT DOCUMENTS 2746154 4/1978 Fed. Rep. of Germany ...... 310/370
2006520 5/1979 United Kingdom ................ 310/370

Primary Examiner—Mark O. Budd
Attorney, Agent, or Firm—Blum, Kaplan, Friedman, Silberman and Beran

[57] ABSTRACT

Cutting a quartz tuning fork crystal vibrator at a preferred angle and with a thickness which establishes a close coupled relationship between the flexural and torsional modes of vibration of the arms or tines produces a vibrator having a highly favorable cubic frequency temperature characteristic at predetermined frequencies. Weight added to the ends of the vibrating tines reduces the frequency of both flexural and torsional vibration, whereas weight added at nodal points in the flexural vibration primarily reduces only the torsional vibrational mode. Accordingly, a wide range of frequency adjustments is possible. Deviations from the desired crystal operating frequency due to manufacturing variances are adjustable by sequential weight modifications while the desirable cubic temperature characteristic is retained. High accuracy over a wide temperature range permits operation in oscillator circuits at relatively low frequencies and with attendant low power consumption. Close coupling between vibrational modes occurs when the difference between the flexural and torsional frequencies is ≦0.15 of the flexural frequency. The principles for dimensioning the crystal, and adjusting thickness and weight, are applicable to both fundamental and overtone frequencies.

45 Claims, 47 Drawing Figures zywφ zyℓφ

FIG. 33
FIG. 34
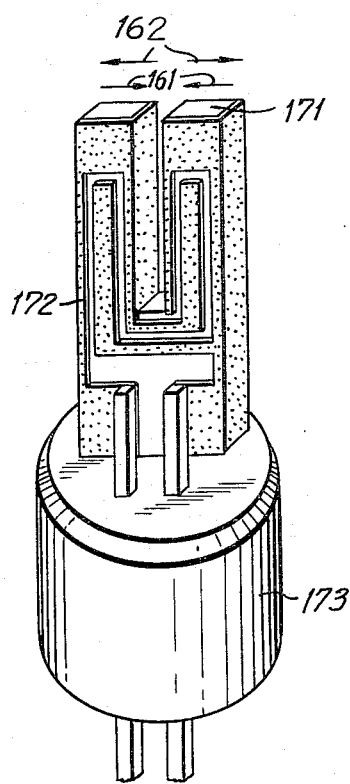
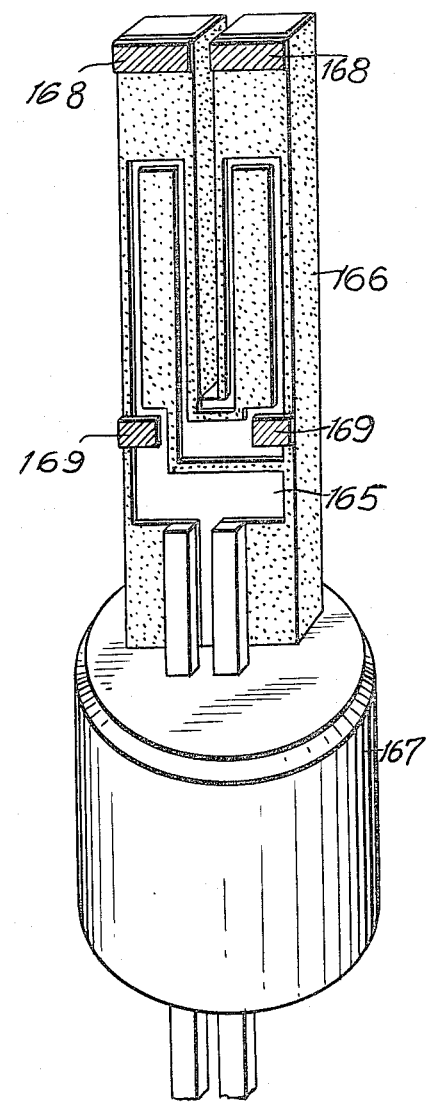

COUPLED MODE TUNING FORK TYPE QUARTZ CRYSTAL VIBRATOR

BACKGROUND OF THE INVENTION

This invention relates generally to a tuning fork quartz crystal vibrator of the type used in electronic wristwatches and more particularly to a tuning fork crystal vibrator which has a highly favorable cubic temperature characteristic and includes weight added to the tines to correct deviations in the resonant frequencies caused by variations in manufacture. Crystal vibrators of the prior art suffer many deficiencies. Generally speaking, unless elaborate precautions are taken, the resonant frequency of the crystal vibrators is unstable when ambient temperature changes. Also, the Q of resonance is low and the effects of aging on frequency can be significant. Further, many crystal vibrators exhibit a change in frequency output depending on the physical attitude or orientation of mounting. Some of these problems resulting from attitude and aging are minimized by operating the vibrator at high frequencies. However, this has the disadvantage of high power consumption. Additionally, many crystal vibrators of the prior art are not sufficiently small in size as to be suitable for electronic wristwatches, and their dimensional variations in mass production are high, resulting in a low yield of acceptable product and a resultant high cost per unit.

Vibrational frequencies in the range of 100 KHZ are treated herein as "low" frequencies based on comparison with outputs of prior art vibrators of other cuts which are used in electronic timepieces.

What is needed is a tuning fork crystal vibrator which exhibits resonant frequency characteristics which are easily set and stable despite ambient temperature variations. Also, it is desirable that the crystal vibrator have a high Q of resonance, low power consumption, little variation due to aging, orientation and mounting method, extremely small size and good manufacturing yields using mass production techniques.

SUMMARY OF THE INVENTION

Generally speaking, in accordance with the invention, a tuning fork crystal vibrator having especially low temperature induced variations in resonant frequency and a high Q of resonance is provided. Cutting a tuning fork crystal vibrator at a preferred angle relative to the X, Y and Z axes, and with a thickness which establishes a close coupled relationship between the flexural and torsional modes of vibration of the arms, produces a vibrator having a highly favorable cubic temperature characteristic at low operating frequencies. Rotation of the cutting angle about the X axis in the ranges of 0 to −15 degrees, 10 to 35 degrees, −25 to −55 degrees, and 25 to 55 degrees, and precise thickness have produced tuning fork vibrators with the desirable cubic temperature characteristic and high Q performance. Weights added to the ends of the vibrator tines simultaneously reduce the frequency of both flexural and torsional vibration, whereas weight added at nodal points in the flexural vibration primarily reduces only the torsional vibration mode. Accordingly, a wide range of frequency adjustments is possible, and deviations from the desired crystal operating frequency due to manufacturing variances are adjustable by sequential weight modifications while the desirable cubic temperature characteristic is retained. High accuracy of resonance over a wide temperature range permits operation in oscillator circuits at relatively low frequencies with attendant low power consumption. Close coupling between vibrational modes occurs when the difference between the flexural and torsional frequencies is equal to or less than 0.15 of the flexural frequency. The principles for dimensioning the crystal and adjusting thickness and weight are applicable to both fundamental and overtone frequencies.

Accordingly, it is an object of this invention to provide an improved tuning fork crystal vibrator having a cubic temperature-frequency characteristic with low variations over a wide performance range of temperatures.

Another object of this invention is to provide an improved tuning fork crystal vibrator having stable temperature-frequency characteristics and a high Q of resonance.

A further object of this invention is to provide an improved tuning fork crystal vibrator having a frequency output which is substantially independent of orientation in mounting the vibrator, and which shows little effect due to aging.

Still another object of this invention is to provide an improved tuning fork crystal vibrator which has a high Q at a low frequency and consumes little power in operation.

Yet another object of this invention is to provide an improved tuning fork crystal vibrator which is extremely small in size and which may be produced with high yields using mass production techniques.

Another object of this invention is to provide an improved tuning fork crystal vibrator which has a favorable temperature-frequency characteristic as a result of selected crystal cutting angles and thickness.

A still further object of this invention is to provide an improved tuning fork crystal vibrator readily adjustable in frequency for manufacturing variations while maintaining the desirable cubic temperature characteristic.

Still other objects and advantages of the invention will in part be obvious and will in part be apparent from the specification.

The invention accordingly comprises the several steps and the relation of one or more of such steps with respect to each of the others, the apparatus embodying features of construction, combinations and arrangement of parts which are adapted to effect such steps, and the article which possesses the characteristics, properties and relation of elements, all as exemplified in the detailed disclosure hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 33 is a quartz crystal tuning fork vibrator mounted on a base;

FIG. 34 is a quartz crystal tuning fork vibrator of this invention mounted on a base and including weights at the roots and ends of the tines;

DESCRIPTION OF THE PREFERRED EMBODIMENTS

Determination of Frequency and Temperature Characteristics

Figure 1:
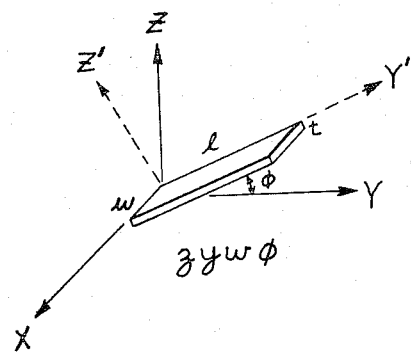
FIG. 1 shows the axes of a quartz crystal and the cutting angle for producing a tuning fork vibrator.
Figure 2:
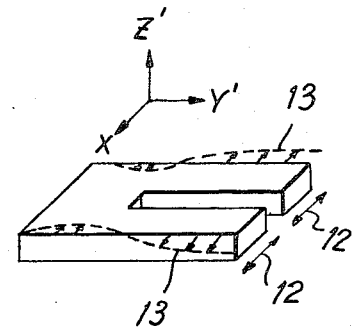
FIG. 2 is a quartz crystal tuning fork vibrator showing the flexural deflections.

FIG. 2 shows a tuning fork crystal vibrator which is used as the time-reference source in a conventional electronic wristwatch. In FIG. 1 is shown a crystal plate 11 cut away at a cutting angle ZXW$\phi$ from a crystal ore in order to make a tuning fork crystal vibrator. In a conventional quartz crystal tuning fork vibrator of the prior art, the angle $\phi$ is in a range from about +2 degrees to about +5 degrees. The symbols in FIG. 1, X, Y and Z, show the known electrical axis, the mechanical axis, and the optical axis of the crystal, respectively. As stated above, reference numeral 11 indicates a crystal plate cut away from the crystal ore at an angle $\phi$ rotated about the X or width axis. A tuning fork crystal vibrator made of the crystal plate 11 is shown in FIG. 2. The direction of flexural displacement in vibration of the tines is indicated by reference numeral 12, and reference numeral 13 indicates the distribution of displacement of the flexural vibration taken along the length of a tuning fork arm, that is, along the rotated axis y' of FIG. 1. The distribution of vibrational displacement along the tuning fork arm is called the vibration mode hereinafter.

Figure 3:
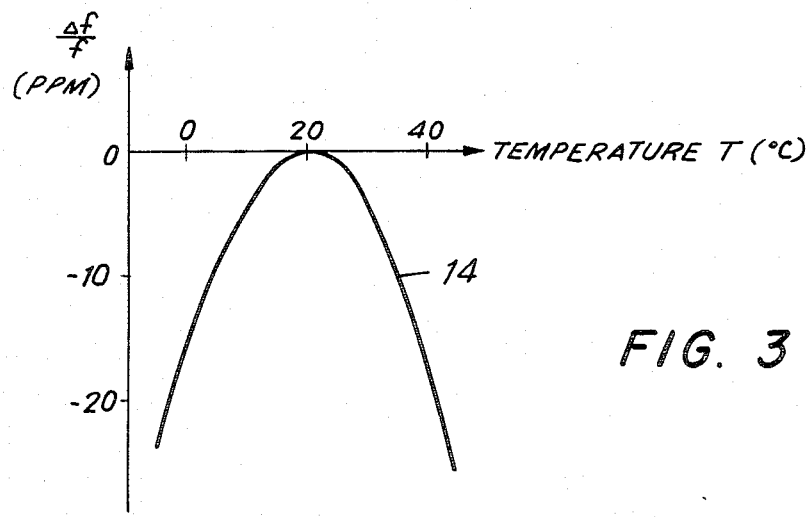
FIG. 3 is a graph showing the second-degree temperature characteristic of a conventional quartz crystal tuning fork vibrator.

The temperature characteristic about the resonant frequency of a conventional tuning fork crystal vibrator having the vibration mode of FIG. 2 is shown in FIG. 3. In FIG. 3, the ordinate axis, Δf/f, is defined as follows:

$$\Delta f/f = \frac{f(T) - f(20)}{f(20)} \quad (1)$$

where, f(T) is the resonant frequency of the vibrator at any temperature T in degrees C. and f(20) is the resonant frequency at 20° C.

As seen in FIG. 3, the resonant frequency of the conventional tuning fork crystal vibrator varies along a second-degree curvature as the temperature varies. Further, in the conventional vibrator, the Q of resonance is as low as 100,000, and the variation of the resonance frequency as a result of long-term aging is high. Also, there is the further disadvantage in the conventional vibrators that the frequency may vary with reference to the orientation of the vibrator relative to the direction of gravity, that is, the frequency varies due to the attitude of the vibrator. AT-cut crystal vibrators of the prior art, which are usually used in communications, show less frequency variation due to aging or due to orientation of the vibrator, but the resonant frequency of operation is so high that large quantities of electrical power are consumed when the crystal oscillator is operating. Further, miniaturization of the crystal vibrator and mass production of the vibrator are not readily accomplished.

Figure 6:
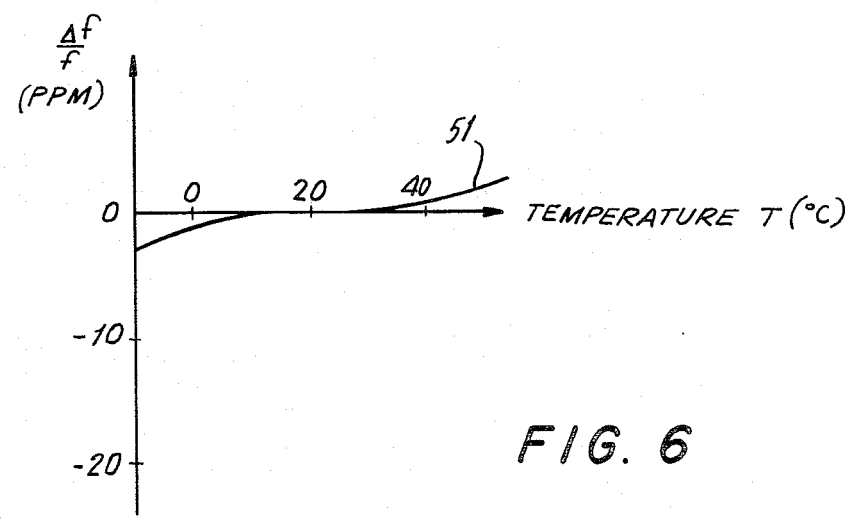
FIG. 6 is a temperature-frequency characteristic having a cubic relationship.

Hereinafter, preferred embodiments of the present invention are described in detail. It should be understood that the word "crystal" as used herein is intended to mean "quartz crystal" or "quartz". An actual example of a frequency-temperature characteristic is shown in FIG. 6 for a tuning fork crystal vibrator of the present invention. The characteristics of the present invention are much superior to those of the conventional type shown in FIG. 3; for example, at 0° the vibrator of the present invention deviates from a resonant frequency at 20° C. by approximately two parts per million, whereas the conventional vibrator of FIG. 3 at 0° deviates from the resonant frequency at 20° C. by approximately 15 parts per million.

Figure 4:
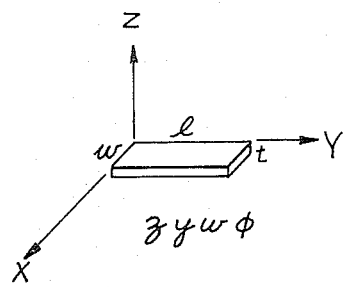
FIG. 4 is a view similar to FIG. 1.
Figure 5:
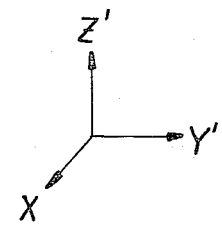
FIG. 5 is a quartz crystal tuning fork vibrator showing both flexural and torsional vibrator modes.
Figure 5:
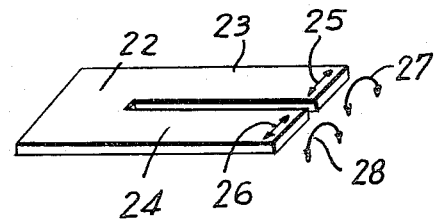

The cutting angle ZXWφ of the crystal plate 21 used for making the tuning fork crystal vibrator of the present invention from a crystal ore is defined in FIG. 4. The angle φ is in a range of 0° to −15° when a counterclockwise direction of rotation around the electrical axis (X) is defined as a positive angle. Again, reference characters X, Y and Z indicate the electrical axis, mechanical axis, and optical axis, respectively. FIG. 5 shows a perspective view of the tuning fork crystal vibrator of the present invention which is made of the crystal plate 21 shown in FIG. 4. The tuning fork crystal vibrator 22 includes a pair of tuning fork arms 23, 24. Vibratory displacement of the tuning fork arms in a fundamental wave of vibration along the X axis is indicated by the double-ended arrows 25, 26. A fundamental wave of torsional vibration of the tuning fork arms 23, 24 about a central axis of each tuning fork arm is indicated by the double-ended curved arrows 27, 28.

Figure 7:
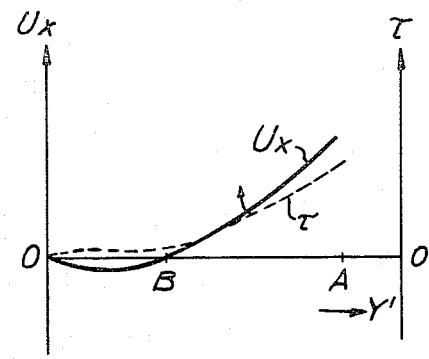
FIG. 7 is a graph illustrating the flexural and torsional deflections along the length of the tuning fork crystal vibrator of this invention.

The amplitude of displacement Ux in the X directions due to a fundamental wave vibration is called the flexural vibration. The Greek symbol τ associated with the broken-line curve of FIG. 7 represents the torsional displacements of the tuning fork arms 23, 24, that is, τ is a distribution of the twisting angles around the central axis of the arms. Both parameters of displacement Ux, τ represent a distribution of displacement along the Y' axis of the vibrator for fundamental waves of vibration in both the flexural and torsional modes of vibration. In FIG. 7, the reference character A indicates the free end of the vibrator tines, and reference character B indicates the base of the tines 23, 24. It can be seen that when the crystal is vibrating, the displacements extend beyond the base of the tines and into the base of the tuning fork itself. As stated above, the distribution of deflection Ux is a measure of the flexural vibration in a fundamental oscillating wave mode. The fundamental wave mode for torsional vibration is represented by the distribution of deflections τ. The fundamental frequency wave is a minimum torsional vibration between A and B. The dimensional values of Ux and τ are opposite to each other, that is, the phases are opposite, between the tuning fork arms 23, 24. For purposes of this description, the resonance frequency providing the vibration mode Ux is called fF, and the resonance frequency of vibration for the torsional mode τ is referred to as fT.

Figure 8:
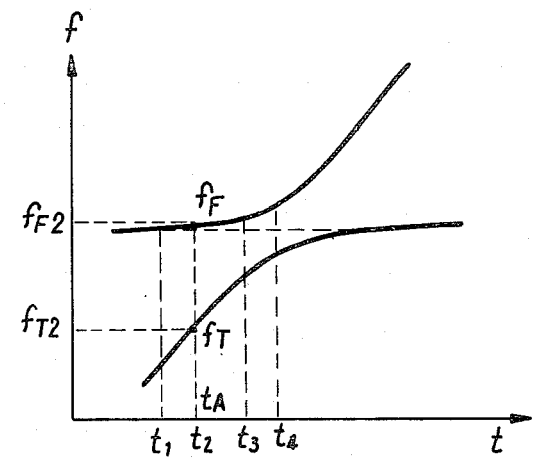
FIG. 8 is a mode chart of frequency versus crystal thickness for the crystal tuning fork vibrators of FIGS. 5 and 14.
Figure 23:
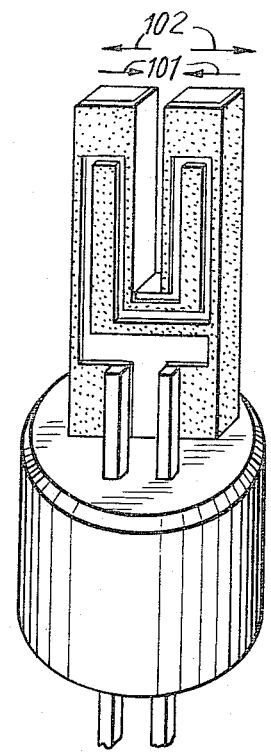
FIG. 23 is a quartz crystal tuning fork vibrator, with electrodes, mounted on a base.
Figure 47:
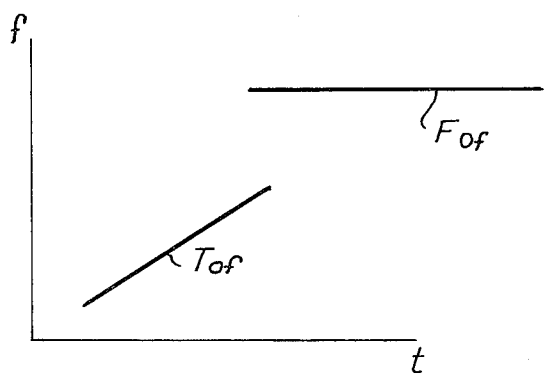
FIG. 47 is a graph of frequency-temperature characteristics for a quartz crystal tuning fork vibrator wherein the torsional and flexural modes of vibration are not coupled.

The dimensions of the tuning fork crystal vibrator 22 (FIG. 5) are selected in outer shape and thickness t, such that the two frequencies fF and fT are closely related to each other. In FIG. 8, the ordinate corresponds to the frequency of vibration, and the abscissa indicates the thickness t of the crystal. When the vibrator is provided with electrodes, for example, as illustrated in FIG. 23, and when the electrodes are energized in a conventional manner, a flexural vibration is induced in the tuning fork. A torsional vibration is also induced around the longitudinal center of the tuning fork arms. As the flexural and torsional frequencies approach each other, a coupling phenomenon occurs. When the two frequencies are coupled, a convergent-divergent characteristic, as seen in FIG. 8, is produced, whereas it might have been anticipated without coupling that the two characteristics would intersect. This uncoupled characteristic is best seen in FIG. 47, where it should be noted that the flexural resonant frequency is independent of thickness, as shown by the horizontal line labeled $F_{of}$. On the other hand, the resonant frequency in torsion $T_{of}$ has a positive linear characteristic with respect to thickness t. However, these independent characteristics exist only where the thickness t is such that the flexural frequency is substantially different from the torsional frequency. As stated above, as the two frequencies come together in value, a coupling effect occurs which changes the independent characteristics of FIG. 47 and produces characteristics like FIG. 8. Notice that when coupled, there is a range of crystal thickness wherein the flexural and torsional frequencies most closely approach each other as thickness increases and then the frequency values diverge as the thickness is further increased.

Figure 9:
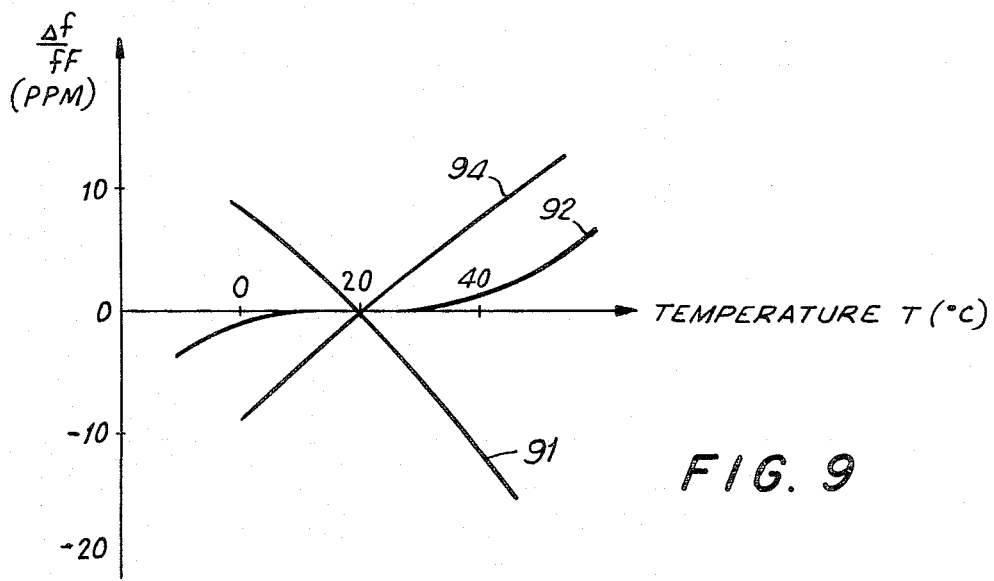
FIG. 9 is a graph similar to FIG. 6 showing the effect of variations in crystal thickness.

In FIG. 9 are shown the frequency temperature characteristics of various crystals of different thicknesses t. The cutting angle φ (FIG. 4) is in the range of 0° to −15°. The temperature characteristic 91 of the resonant frequency fF is produced when t=t₁, as seen in FIG. 8, that is, t₁ is less than the thickness which produces the minimum difference between the flexural and torsional frequencies. The temperature characteristic 91 is substantially linear, that is, of the first degree, having a negative slope. The characteristic 92 is a typical example when thickness t is in the range between $t_2$ and $t_3$, as seen in FIG. 8. This characteristic 92 is of the cubic equation form and shows deviations in frequency with temperature both above and below the nominal fundamental oscillating frequency at 20° C. The temperature characteristic 94 around the nominal resonant frequency fF is produced when $t=t_4$, as seen in FIG. 8, that is, the two frequency characteristics are again diverging as thickness increases. This temperature characteristic 94 again is of the first order, exhibiting a linear characteristic with a positive slope. Thus it can be seen that as the two frequencies, flexural and torsional, approach each other in magnitude, there is a coupling effect as thickness increases, and the temperature characteristic changes from a negative linearly sloping characteristic to a positive linearly sloping characteristic. Between these extremes, there occurs the characteristic 92, which closely conforms to the abscissa and indicates a highly accurate and stable oscillating frequency over a substantially wide range of temperatures, for example, from 0° to 40° C. Quartz crystal tuning fork vibrators cut at an angle $\phi$ between 0 and −15 degrees and having a thickness t in the order of 88.5 microns have exhibited desirable temperature characteristics similar to the characteristic 92 of FIG. 9.

The ordinate in FIG. 9 is $\Delta F/fF$, that is, $\Delta F$ is the difference between the flexural and the torsional frequencies. This difference is algebraically expressed as $fF-fT$. When the difference $\Delta F$ divided by the resonant flexural frequency fF is equal to or less than 0.15, the two frequency modes are coupled. This condition is shown in the equation as follows:

$$\left| \frac{fF - fT}{fF} \right| = \frac{\Delta f}{fF} \leq 0.15 \quad (2)$$

In FIG. 8, when $$\frac{fF_2 - fT_2}{fF_2} = 0.15 \quad (3)$$

the thickness t is greater than $t_2$ of FIG. 8. As stated above, the superior cubic frequency characteristic 92 is obtained by properly selecting a value of thickness t between $t_2$ and $t_3$.

The temperature characteristics with respect to frequency shown in FIGS. 3, 6 and 9 may be approximated as follows under a Taylor's expansion on Equation 1.

$$\frac{\Delta f}{f} = \frac{f(T) - f(20)}{f(20)} \simeq \alpha(T - 20) + \quad (4)$$
$$\beta(T - 20)^2 + \gamma(T - 20)^3$$

$\alpha \equiv f'(20)/f(20)$
$\beta \equiv f''(20)/(2f(20))$
$\gamma \equiv f'''(20)/6f(20))$ Up to the third term, as shown in Equation 4, the Taylor's series approximates with substantial accuracy the function $\Delta f/f$ at $T=20$, and $\alpha$, $\beta$ and $\gamma$ are the first, second and third temperature coefficients, respectively. High-order terms above the third power in the Taylor's series are of little significance and need not be considered here. As shown in FIG. 8, when the values fF and fT are near values, that is, the frequencies are close together, they will interfere or couple with each other. To the contrary, when the values fF and fT are sufficiently different from each other (FIG. 47), the frequencies are not coupled and the values fF and fT have independent temperature characteristics with respect to frequency.

Figure 10:
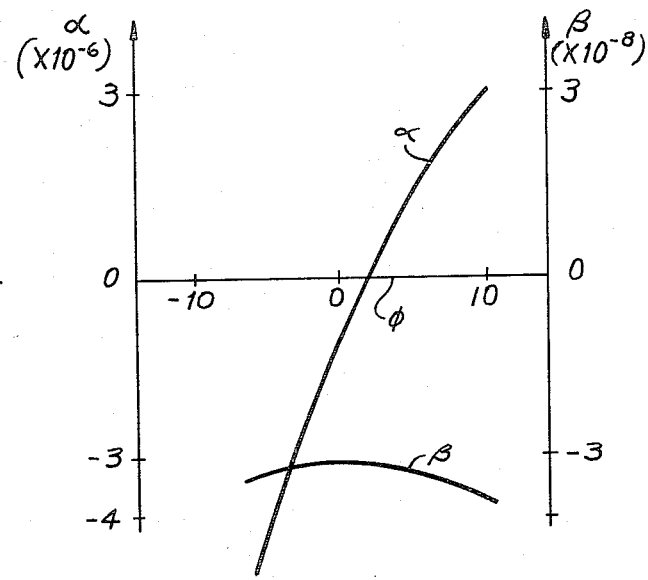
FIG. 10 is a graph showing the effect of crystal cutting angle on parameters affecting the temperature characteristic of a conventionally cut crystal tuning fork.

FIG. 10 shows variation in the temperature coefficients $\alpha$ and $\beta$ of Equation 4, which in turn vary the temperature characteristic of the tuning fork crystal vibrator. In FIG. 10, the crystal cutting angle $\phi$ is varied under a condition where the flexural frequency fF and the torsional frequency fT are sufficiently separated such that the mode of vibration are not coupled but are independent of each other. FIG. 10 shows that the value of $\alpha$ is approximately equal to zero when the cutting angle $\phi$ is in the range of 2 to 5 degrees. In this range, the value of $\gamma$ is sufficiently low so as to be insignificant in the equation (4) and the temperature characteristic with respect to frequency is dominated by the value of $\beta$. That is, the second degree term of the equation dominates under this condition of cutting, and produces a typical tuning fork crystal vibrator characteristic of the prior art as shown in FIG. 3. Thus, the validity of using the Taylor series expansion is demonstrated in its application to the conventionally cut crystals of the prior art. The tuning fork crystal vibrator of this invention has the suggested result of both mathematical analysis and empirical testing in the laboratory.

In the present invention, the purpose is to provide a mutual interference or coupling between the frequencies fF and fT by bringing them close together in value, and to improve the temperature characteristic with respect to frequency by closely correlating the resonant frequency fF of the fundamental wave of the flexural vibration and the fundamental resonant frequency of the torsional vibration fT (FIG. 8). A first step in designing such a tuning fork crystal vibrator is selecting a thickness in the range of $t_1$, $t_2$, $t_3$ and $t_4$ such that the value fF and fT are closely related with each other. Then as shown in FIG. 8, a change in the value of fF brings about a change in the value of fT. There is a greater interaction when t equals $t_2$ than when t equals $t_1$. Similarly, the effect is increased in sequence to $t_2$, $t_3$ to $t_4$. There is greater coupling between the frequencies and modes of vibration as thickness increases from $t_1$ to $t_4$. As seen in the relationship between FIGS. 8 and 9, the temperature characteristic is a function of the value of fF and further depends on the thickness t.

Figure 18:
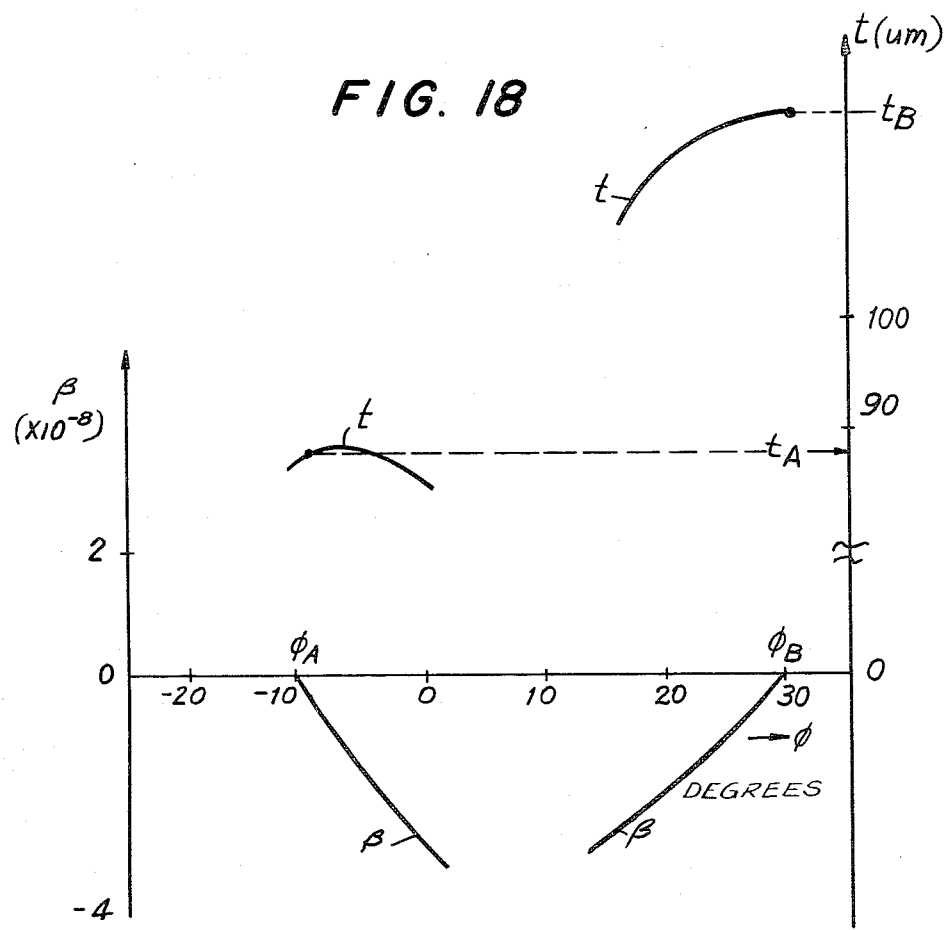
FIG. 18 is a graph showing the effect of the cutting angle of FIG. 16 on parameters affecting the temperatures characteristics of the vibrator.

In FIG. 18 is shown a crystal design in which the thickness t is adjusted versus angles of the cutting angle such that the value of $\alpha$ always equals zero. Variations of $\beta$ vs. $\phi$ are also shown as the thickness is adjusted. There are two points in FIG. 18 where the value of $\beta$ substantially equals zero. These conditions occur when the cutting angle $\phi$ is approximately 10 degrees negative and when the cutting angle $\phi$ is positive 30 degrees. The points on the graph of FIG. 18 where $\beta$ is zero are at $\phi$ equal $\phi_A$, t equals $t_A$ and at $\phi$ equals $\phi_B$ and t equals $t_B$.

Figure 11:
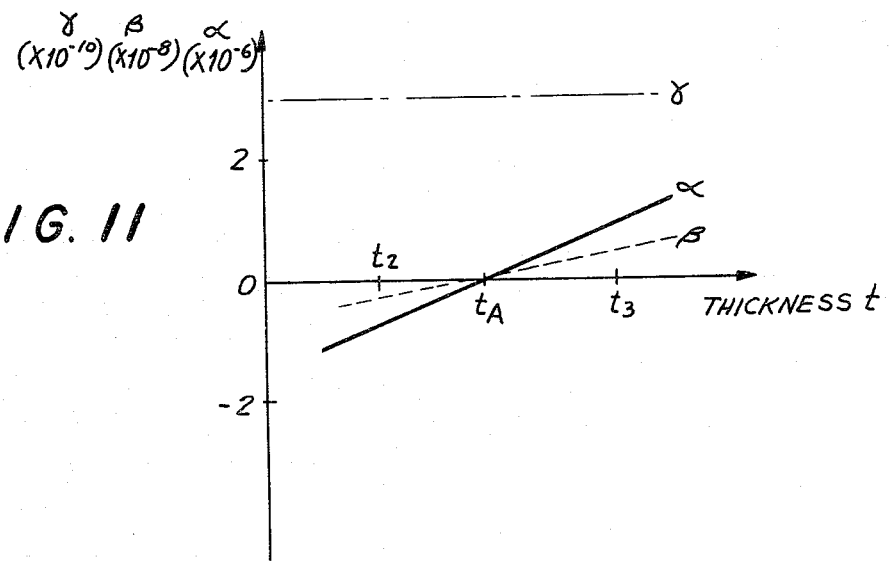
FIG. 11 is a graph showing the effect of crystal thickness on parameters affecting the temperature characteristic of vibrators of this invention.
Figure 16:
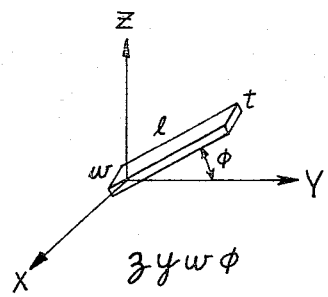
FIG. 16 is a view similar to FIG. 1.

FIG. 11 shows the effect on temperature coefficients of varying thickness t when the crystal has been cut at the angle $\phi$ equals $\phi_A$. As stated above, at a thickness t equals $t_A$, $\alpha$ equals zero and $\beta$ equals zero. At this condition where $\phi$ equals $\phi_A$ and t equals $t_A$, it can be seen in Equation 4 that the frequency-temperature characteristic will depend only upon the third order term coefficient $\gamma$. Thus, the curve will show third degree, cubic characteristics. This is the desirable temperature characteristic with respect to frequency for the tuning fork of the present invention as identified by numeral 92, FIG. 9 and in FIG. 6. The correct values of the cutting angles φ and the thickness $t_A$ depend upon the external shape of the crystal vibrator and the frequencies of fF and fT. For a tuning fork crystal vibrator of this invention, having a fundamental wave frequency of flexural vibration of approximately 100 KHZ, the favorable cubic temperature characteristic with respect to frequency shown in FIG. 6 is provided when ΔF, that is, fF−fT, approximately equals 1 to 10 KHZ. The thickness t is in the order of 80 to 100 microns and φ is approximately minus 11 degrees. More particularly, a tuning fork arm having a thickness t of 88.5 microns, width of 575 microns, and length of 1,670 microns produces the characteristic of FIG. 6. As shown in FIG. 6, the crystal vibrator is accurate to less than 1.6 parts per million (PPM) in a range from zero to 40 degrees C. Other values of fF, fT, t, and φ may also be obtained by a theoretical analysis with reference to the coupling of the two frequencies and experimentally in the laboratory. It should be noted with reference to FIGS. 11 and 18, that the γ term dominates the equation even when α and β are not precisely at zero but are substantially zero. Thus, favorable characteristics may be achieved when φ is in the range of zero to minus 15 degrees and also in the range of plus 10 to 35 degrees. The range of plus 10 to 35 degrees corresponds generally to φ equals $φ_B$ and t equals $t_B$ in FIG. 18. FIG. 16 again defines the cutting angle zyw φ as being the angle of rotation about the X axis of the crystal.

Figure 17:
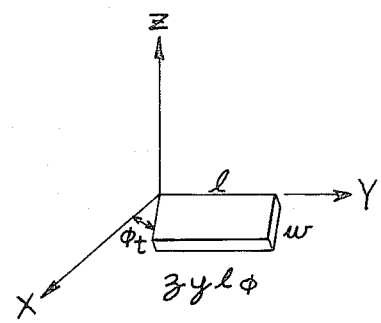
FIG. 17 is a view similar to FIG. 16 and showing a different cutting angle.
Figure 19:
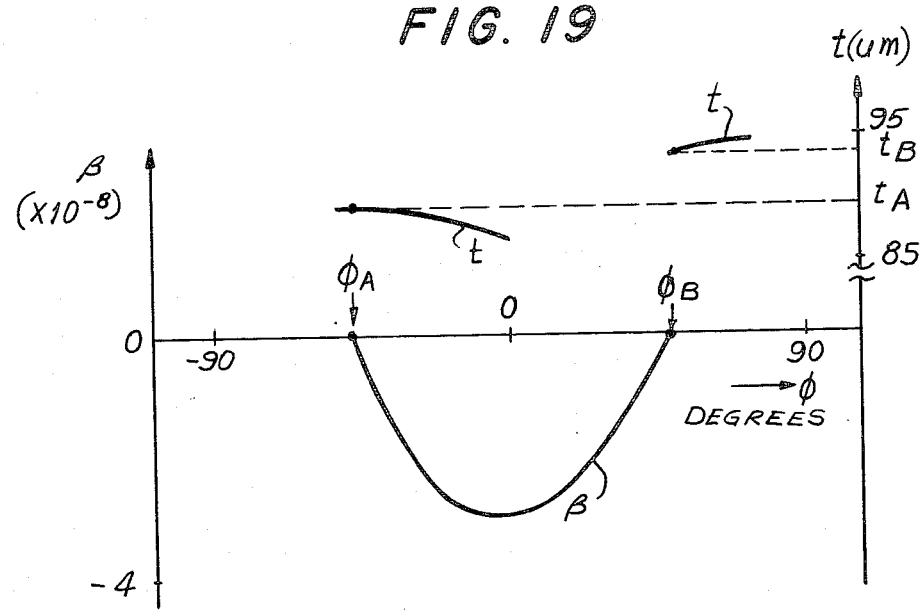
FIG. 19 is a graph showing the effect of the cutting angle of FIG. 17 on parameters affecting the temperature characteristics of the quartz crystal vibrator.

The special characteristics which may be derived from coupling of the frequencies is not limited to crystal cutting angles φ where the crystal plate is rotated about the X axis. FIG. 17 illustrates the condition where the crystal plate is rotated about the Y axis of the crystal ore. The cutting angle is defined as zy1 φ and a counterclockwise rotation viewed from the positive side of the Y axis is defined as a positive cutting angle. Again, a proper thickness t can be selected so that the values of α and β are equal to zero for a particular cutting angle φ. With reference to FIG. 19, the values of α and β equal zero when the value of t equals $t_A$ and when φ equals $φ_A$. Thereby, stability shown in the temperature characteristic of FIG. 6 is obtained. Also the desirable characteristic of FIG. 6 is provided when the value of t equals $t_B$ and φ equals $φ_B$. So, in FIG. 19, as in FIG. 18, two ranges of cutting angles exist where the proper adjustment of thickness provides a substantially dominant cubic term in the equation (4), that is, where α and β are relatively insignificant compared to γ. As seen in FIG. 19, and as determined empirically in the laboratory, cutting of the crystal ore at an angle φ rotated around the mechanical axis Y in the range of minus 25 to minus 35 degrees produces the desirable characteristic of FIG. 6 representative of φ equals $φ_A$ and t equals $t_A$. Also, a cutting angle φ of +25 to +55 degrees produces crystals having the desirable characteristic of FIG. 6 and corresponds to the condition of FIG. 19 where φ equals $φ_B$ and t equals $t_B$. It will be understood that the thicknesses $t_A$ and $t_B$ having the desirable temperature characteristic of FIG. 6 are the thicknesses which cause the difference between each of the frequencies in the fundamental wave mode, that is, between the fundamental flexural vibration and the fundamental torsional vibration in the tuning fork, to be less than 15% of the frequency of the fundamental mode of the flexural vibration. It is when this difference in frequency is less than 15% of the fundamental flexural frequency, that the present favorable effect is produced as a result of the coupling between the frequencies. The stated cutting angles $φ_A$, $φ_B$, are practical examples of cutting angles which give satisfactory performance. Even when the crystal plate is cut at an angle of rotation, slightly differing from these cutting angles, the above described advantageous effects on the temperature characteristics may be obtained.

Figure 13:
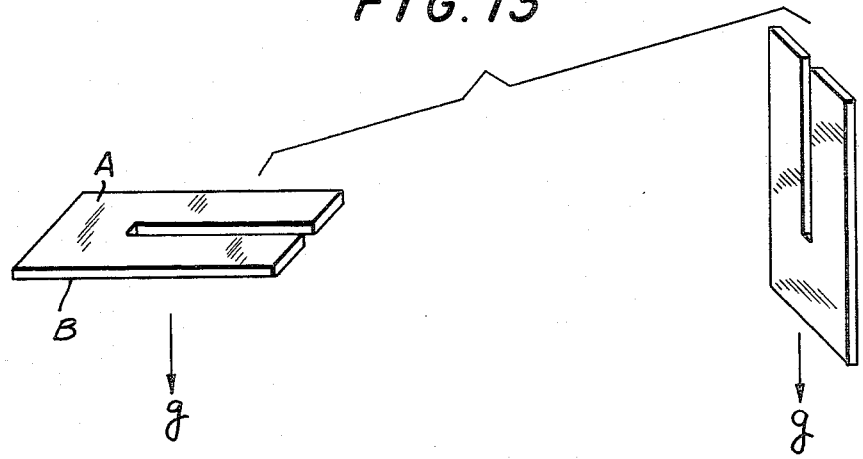
FIG. 13 illustrates attitudes for mounting the quartz crystal tuning fork vibrator of this invention.

The conventional tuning fork crystal vibrator shows a parabolic temperature characteristic in the range of 20°±20° C. with respect to the resonant frequency of vibration of 14 PPM (FIG. 3). The tuning fork of the present invention has improved this temperature characteristic value to less than 1.6 PPM over the same temperature range. This is a breakthrough in tuning fork crystal vibrator design fulfilling an objective of providing a resonant frequency which is stable against variations in ambient temperature. To further the comparison, the Q of a conventional tuning fork crystal vibrator is in the range of 70,000 to 100,000 whereas the tuning fork of the present invention shows a value of Q of the resonant frequency about 100,000 to about 150,000. With this high Q of resonance, stability of the oscillating frequency is further improved and frequency variation due to aging is decreased. With the conventional tuning fork crystal vibrator a difference in attitude causes a shift in the resonant frequency of vibration, the frequency being responsive to the direction of gravity. As illustrated in FIG. 13, the resonant frequency changes depending on which of the plate surfaces A or B of the tuning fork crystal vibrator faces downward or upward. The reference character g shown in FIG. 13 indicates the direction of the acceleration of gravity. Because the elasticity constant of a crystal vibrator has anisotropy and because the crystal plate has been cut away from the crystal ore at an angle displaced from the X-Y plane, gravity has different effects on the frequency response depending on whether the A or B surface of the crystal ore is facing downward. In other words, the resonant frequency of the same tuning fork crystal vibrator is different when the flat planar surfaces A, B are horizontally oriented as compared to the condition when the flat planar surfaces A, B are vertically oriented. This has been a problem with the conventional prior art tuning fork vibrators. In order to minimize the effect of orientation on resonant frequency such techniques as increasing the resonant frequency have been employed, and overtone frequencies have been used rather than fundamental frequencies. The tuning fork crystal vibrator of the present invention has a relatively low difference in resonant frequency due to orientation because of the high frequency of the fundamental at about 100 KHZ. The difference caused by changes in attitude in the prior art conventional tuning fork vibrator is in the order of 0.02 PPM and the present invention has a lower value.

Figure 12:
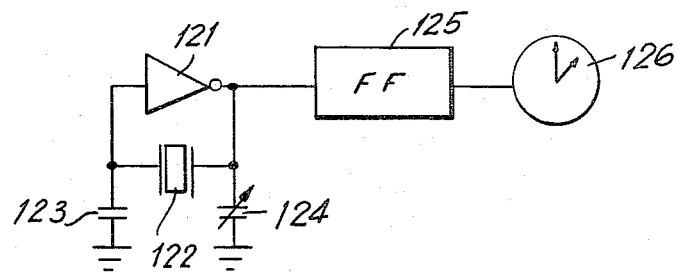
FIG. 12 is the functional block diagram of a timepiece using the quartz crystal tuning fork vibrator of this invention.

An electrical block diagram of a practical timepiece is shown in FIG. 12, indicating an arrangement using a crystal oscillator having a tuning fork crystal vibrator of the present invention. The inverter 121 includes complementary MOS transistors and is connected across the tuning fork crystal vibrator 122 of the present invention. Capacitors 123, 124 complete the oscillator circuit and a frequency divider 125, for example, a flip-flop network, is used for dividing the output of the oscillator. The display device 26 presents the time for visual inspection, for example, the face of a wristwatch. It is not necessary to have a special circuit arrangement in the oscillator in order to cause the tuning fork crystal vibrator 122 of the present invention to oscillate about the fundamental wave mode of flexural vibration. Because the resonant resistance of the torsional resonant mode fT is usually significantly higher than the resonant resistance to flexural vibration at the fundamental frequency fF, the tuning fork vibrator of this invention oscillates in the oscillator circuit only at the flexural frequency fF even when the oscillator circuit is a conventional one having no particular circuit variations. Thus, the oscillator circuit will have the frequency characteristics, for example, the frequency-temperature characteristic, of the fundamental flexural mode fF as described above. It is needless to say that in order to easily initate the oscillation of the vibrator at the fundamental frequency fF, special circuit arrangements may be provided to reduce resistance at start-up, and a particular pattern of electrodes, affixed to the surface of the tuning fork crystal vibrator, may be used for increasing the resistance when oscillating at resonance. Also, the oscillator need not use complimentary MOS transistors but may be a normal transistor type oscillator or a vaccum tube oscillator.

Because conventional oscillator circuitry is used with the tuning fork vibrator of this invention, existing crystal oscillator circuits may be adapted to use this crystal vibrator without any modification in electronic wristwatches wherein low power consumption has already been realized. Further, the standard AT cut crystal vibrator has a good temperature characteristic with respect to frequencies in the megahertz ranges. The present tuning fork vibrator oscillates at about 100 KHZ, that is, at one-tenth of the frequency of the AT cut crystal. Because the power consumption of an oscillator is approximately proportional to the oscillation frequency, the power consumption is approximately one-tenth when the crystal vibrator of the present invention is used in a timepiece application as illustrated in FIG. 12.

Also, recently, electronic timepieces have been produced with superior temperature characteristics with respect to frequency by applying two conventional tuning fork crystal vibrators having different temperature characteristics. The differences in frequency between the two oscillators are utilized as a standard for measuring the temperature correction which is required.

With the tuning fork crystal vibrator of the present invention, the superior temperature characteristic may permit use of a single crystal vibrator and a single conventional oscillator circuit to achieve a highly temperature stable timepiece. Also, when the fundamental resonant frequency in flexural vibration is used as the basic high frequency timekeeping signal in a wristwatch, the low frequency of operation provides for low power consumption.

Figure 14:
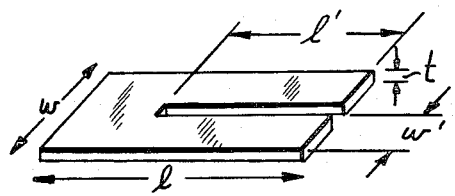
FIG. 14 shows a quartz crystal tuning fork vibrator of this invention and defines physical dimensions.

FIG. 14 is an overall perspective view of a preferred embodiment of the tuning fork crystal vibrator of the present invention defining the dimension of length l, width w and as stated above t. Tuning fork crystal vibrators of the present invention can be formed such that for a fundamental flexural frequency fF of about 100 KHZ, the outer dimensions are, for example, in the range of l equals 3 to 4 mm, w equals 1.0 to 1.5 mm, and t is in the range of 50 to 150 microns. This compares with a conventional tuning fork crystal fork vibrator of the prior art having a length of 6 mm, a width of 1.5 mm, and a thickness of 500 microns. Thus, relative to the prior art tuning fork vibrator, the vibrator of the present invention is small in size. AT cut crystal vibrators, which are known as highly accurate vibrators, are formed as a circular flat plate or a rectangular flat plate, having a diameter of 10 mm or a width of 3 mm with a length of 10 mm, respectively. Further, the thickness is high, in the order of 800 microns, when the frequency is in the two megahertz range. Thus, in comparison to the circular and rectangular crystal vibrators, the tuning fork vibrator of the present invention is extremely small and is suitable for use in an electronic wristwatch or other small sized equipment as the time reference source.

Figure 15:
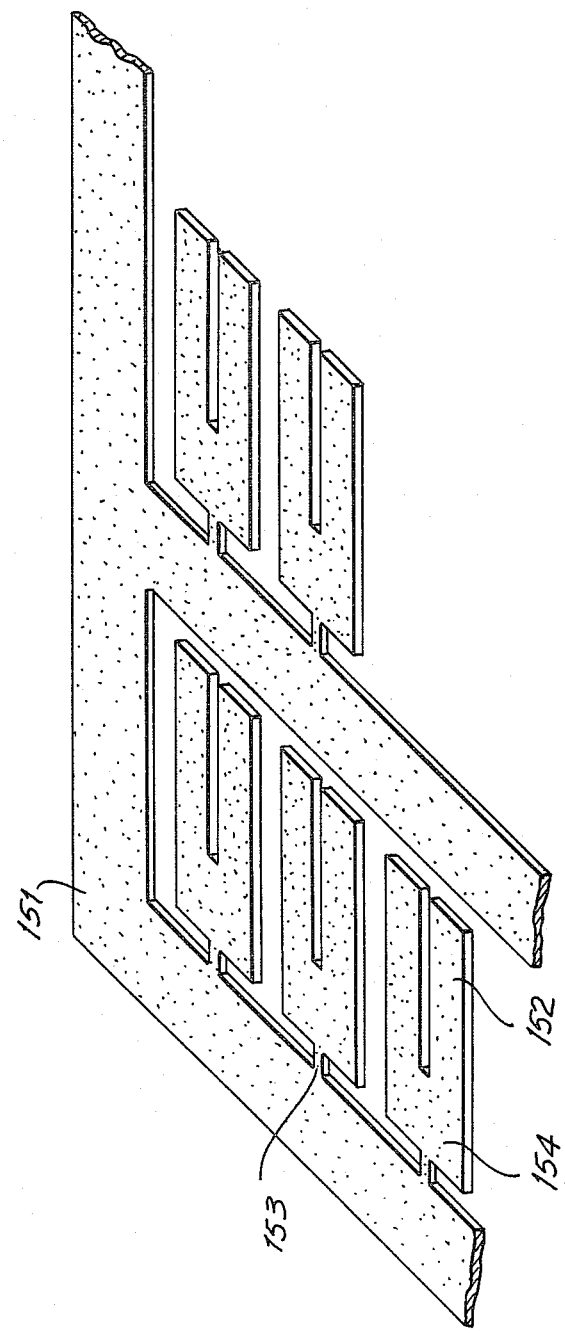
FIG. 15 is a view illustrating the techniques for manufacturing the quartz crystal tuning fork vibrator of this invention.

FIG. 15 shows a practical example of a step in the manufacturing process of the tuning fork crystal vibrator of the present invention. First, films of chromium and gold are adhered to both surfaces of a thin quartz plate or wafer which has been mirror-ground to a thickness in the order of 50 to 150 microns. The film is formed by a vacuum depositing or sputtering process. A coating of photo-resist is applied. Then the films are exposed through a glass mask on which a number of outer configurations of the tuning fork crystal vibrators of the present invention are printed for the purpose of fixing the photo-resist coating. The resist coating which is not exposed is removed by using a solvent and the remaining resist portion is used as a mask. Then the exposed films of chromium or gold are dissolved. The remaining films of chromium and gold are used as a mask and the thin wafer of quartz is dipped in an etching liquid of hydrofloric acid. Thereby, the unneeded portion of the thin quartz wafer is removed and tuning fork vibrators of the present invention are provided exactly corresponding to the shape of the mask.

In FIG. 15, the crystal vibrator 152 is joined to the frame by the connecting portion 153 after the acid etch is completed. The dual films 154 of chromium or gold are affixed to both the front and back surfaces of the crystal vibrator and serve as the energizing electrodes. It is unnecessary to say that the pattern of the electrode film may be shaped to any configuration when a glass mask is used for making the pattern. Under conditions as illustrated in FIG. 15, a large number of tuning fork crystal vibrators of the present invention may be made after separation of the connections 153. The above described process of fabrication is known as photo-lithography. Thus, because the tuning fork crystal vibrator of the present invention has a thickness and outer shape as shown in FIG. 14, it is possible to apply the manufacturing process of photo-lithography which enables mass production of the vibrators. Photo-lithography may be applied for making the tuning fork crystal vibrators of the present invention because of the vibrator thickness which is in a range of 50 to 150 microns. Thus, the design of the vibrators of the instant invention have the advantage of permitting fabrication by photo-lithography techniques.

Figure 21:
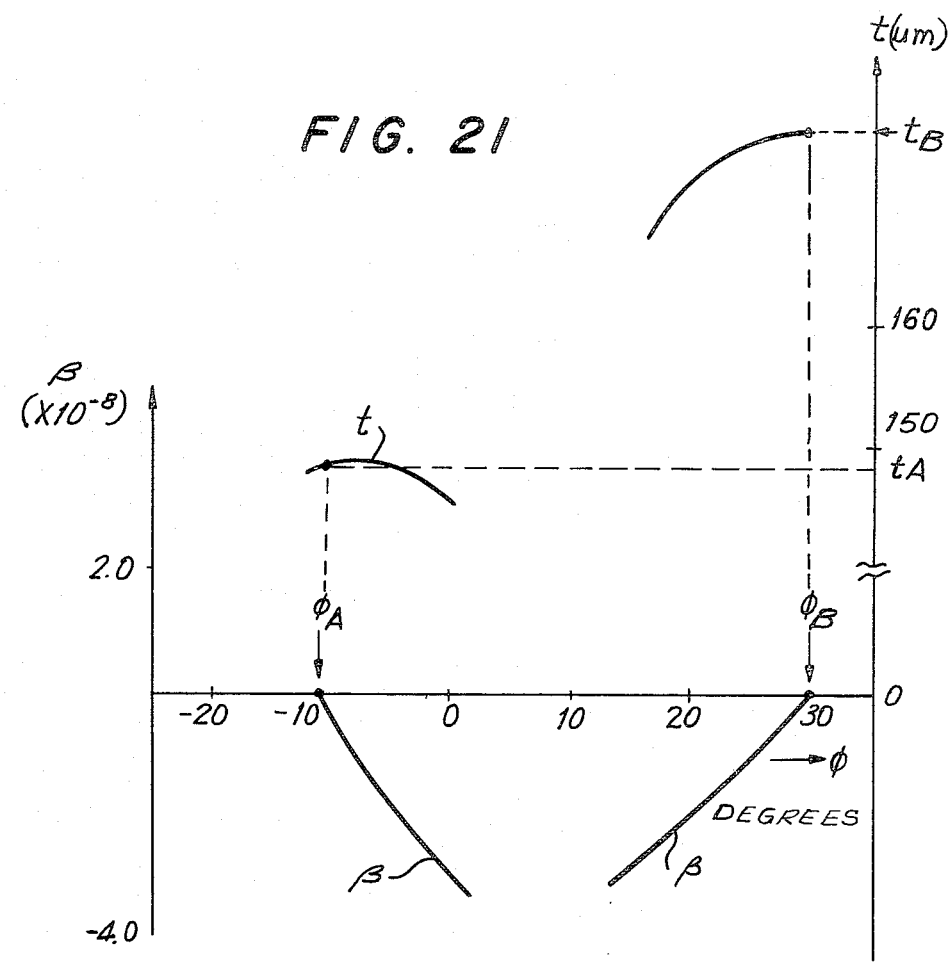
FIGS. 21 and 22 are graphs similar to FIGS. 18 and 19, respectively, showing temperature characteristic parameters with respect to overtone frequencies.

In the above discussion, the vibrational frequency in the flexural mode was the fundamental frequency of vibration fF. It has been found that the principles applicable to the fabrication of tuning fork crystal vibrators relative to the fundamental flexural frequency of vibration are equally applicable to overtones of the fundamental flexural vibration. Thus, FIGS. 4, 5 and 6 are applicable where the overtone frequency is used. However, it should be understood that the frequency f in the ordinate of FIG. 6 now refers to an overtone frequency of vibration rather than the fundamental frequency of vibration as discussed above. Similarly, FIGS. 8 and 9 are applicable to overtone frequencies in flexure where it is recognized that the symbol F for flexural vibration now represents the overtone frequency. However, it should be noted that in FIG. 8 the symbol fT represents as before, the fundamental mode of torsional vibration. The Taylor series expansion, equation (4), continues to be applicable with respect to the overtone frequency characteristic as it is affected by changes in temperature. Accordingly, the values of the coefficients $\alpha$, $\beta$ and $\gamma$ in the Taylor series remain substantially the same as those shown in FIG. 11 when the cutting angle zyw$\phi$ equals $\phi_A$, and the vibrator is evaluated in terms of the overtone of the flexural vibrational frequency. Also, it should be noted that under current conditions where $\alpha=0$, the combination of $t_A$ and cutting angle $\phi_A$ produce a condition where $\beta=0$ as seen in FIG. 21. Also, at the conditions when the cutting angle is $\phi_B$ and thickness is $t_B$, the coefficient $\beta$ is again zero. The similarity between FIG. 21 and FIG. 18 is noteworthy; the significant difference being that a larger thickness t is required to produce a condition where $\gamma$ is dominant and $\alpha$ and $\beta$ are substantially zero when working with the overtone of the flexural vibrational frequency. The cutting angle $\phi$ of FIG. 21 is defined in FIG. 16.

Figure 22:
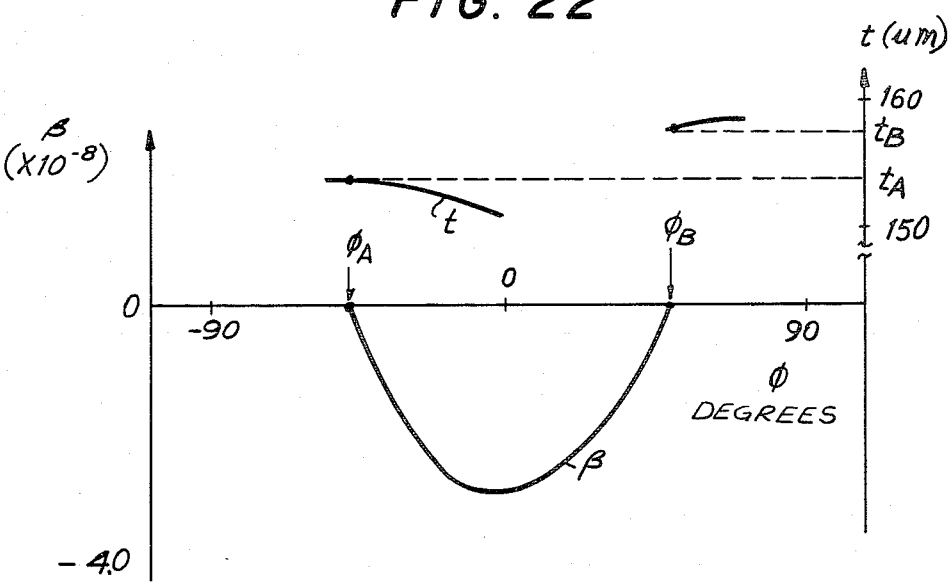

FIG. 22 is similar to FIG. 19 except that once again, when working with the overtone of the flexural vibrational frequency, the thickness required to provide a zero value for the coefficient $\beta$, is greater than the thickness of FIG. 19 where the fundamental flexural frequency is utilized. The favorable temperature-frequency characteristic of FIG. 6 is produced for essentially the same values $\phi_A$ and $\phi_B$ whether the fundamental or the overtone flexural frequency is used. The angle $\phi$ is defined in FIG. 17. Thus, for example, the cutting angle $\phi$ in the range of zero to minus 15 degrees will produce a condition where the coefficient $\gamma$ is dominant in the equation (4) and $\gamma$ and $\beta$ are relatively insignificant, whereby the desirable cubic temperature-frequency characteristic is provided relative to the overtone flexural vibrational frequency of the tuning fork of this invention.

Coupling of the flexural and torsional frequencies fF and fT respectively, is still a necessity to achieve the desired cubic temperature characteristic of FIG. 6. Equations (2) and (3) and applicable where the difference in frequency $\Delta$F is now measured as the difference between the flexural overtone frequency and the torsional fundamental frequency. This difference divided by the value of the flexural overtone frequency is equal to or less than 0.15 to produce the desired coupled frequency effect. Thus, with reference to FIG. 8 when fF−fT/fF=0.15, thickness t is more than $t_2$.

FIG. 11 shows how the temperature coefficients $\alpha$, $\beta$, $\gamma$ of equation (4), which affect the frequency-temperature characteristic of the overtone of the flexural frequency of vibration, are varied in reference to variations in the thickness t when $\phi$ equals $\phi_A$. In FIG. 11 when $t=t_A$, $\alpha=0$ and $\beta=0$. Thus, as before when dealing with the fundamental flexural frequency, the temperature characteristic with respect to the overtone frequency of flexural vibration will depend substantially upon the third coefficient $\gamma$ and show a third degree temperature-frequency curve. This cubic temperature characteristic with respect to frequency of the tuning fork crystal vibrator of the present invention is indicated by reference numeral 92 and in FIG. 6.

As stated above, the correct values of the cutting angle zyl and $\phi$ and the thickness t depend upon the external shape of the tuning fork crystal vibrator and the frequency of the overtone in flexural vibration and the fundamental in torsional vibration. A frequency-temperature characteristic as shown in FIG. 6 is provided relative to the overtone when the fundamental wave of the flexural vibration is about 32 KHZ. An overtone of flexural vibration in the order of 200 kilohertz, coupled to a fundamental torsional frequency which is only 5 to 15 KHZ less than the overtone frequency, is used to provide the desirable cubic temperature characteristic when the thickness t is in the order of 130 to 180 microns and $\phi$ is in the order of minus 10 degrees. Other values of the flexural overtone frequency, the fundamental torsional frequency, thickness, and cutting angle $\phi$ can also be derived by theoretical analysis and by laboratory experimentation to produce coupled frequencies and the desired cubic temperature characteristic. As seen in FIG. 6, a coupled tuning fork vibrator as described deviates from the nominal frequency at 20° C. by less than 1.6 PPM over a range of 0° to 40° C.

Summarizing, with reference to FIG. 21, cutting angles for turning fork vibrators which have a thickness suitable to provide coupling, will have the desirable cubic characteristic when $\phi$, the cutting angle, is in the range of about zero to minus 15 degrees and also in the range of plus 10 to 35 degrees.

With respect to the characteristics of FIG. 22, cutting the crystal at an angle $\phi$ rotated around the Y axis and having a thickness in the range which causes coupling of frequencies, produces the desired cubic temperature characteristic when $\phi$ is in the range of minus 25 to minus 35 degrees or in the range of plus 25 to plus 55 degrees. In all these conditions relevant to FIGS. 21 and 22, the $\gamma$ coefficient dominates the equation (4) and the effects of $\alpha$ and $\beta$ are minimum as discussed above. A preferred thickness, nominally identified in FIGS. 21, 22 as $t_A$ and $t_B$ causes the fundamental torsional vibrational frequency to be less than, that is, within 15% of the frequency of the overtone of the flexural vibration. The ranges of cutting angles $\phi$, indicate that even when the crystal plate is rotated slightly in any direction from these cutting angles, the above described advantageous effect, that is, the cubic temperature characteristic, may still be obtained based on the same principles as previously described.

Figure 20:
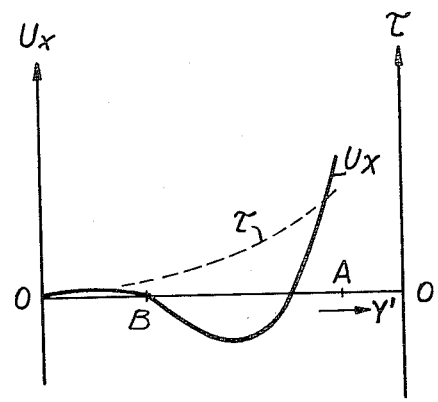
FIG. 20 is a view similar to FIG. 7, showing deflections of an overtone of the flexural mode of vibration.

FIG. 20 illustrates the physical displacements along the length of the tuning fork arms which occur in an overtone mode of flexural vibration. It should be noted that the torsional displacements are of similar magnitude and distribution as in FIG. 7, because in both instances, the torsional vibration is at the fundamental frequency. However, in FIG. 20, it can be seen that the flexural displacement Ux of the tuning fork vibrator is considerably changed in comparison to FIG. 7 in that with the overtone of flexural vibration, there are now two nodal points along the length of the vibrator where displacement is zero. In FIG. 7, only one nodal point existed at point B, with zero displacement. In the overtone mode (FIG. 20) the Q of resonance is extremely high because the resonant frequency of the vibrator is an overtone vibration. A conventional prior art tuning fork crystal vibrator shows a Q in the range of 70,000 to 100,000. The vibrator of the present invention shows a value of Q at the resonant overtone frequency from about 150,000 to 300,000. A high value of Q is a measure of stability in oscillation, and the frequency stability of an oscillator circuit using the vibrator of the present invention is improved. Also, frequency variations due to aging are decreased. A prior art tuning fork crystal vibrator shows variation due to aging in the order of $1\times10^{-5}$ to $1\times10^{-6}$ PPM per year. The variation in overtone frequency due to aging in the tuning fork crystal vibrator of the present invention is in the order of $1\times10^{-6}$ to $1\times10^{-7}$ PPM per year. This is a great improvement.

The effect of orientation of the crystal in its mounting was discussed above. The tuning fork crystal vibrator of this invention when operating in the overtone mode of flexural vibration is even more stable than the vibrator of this invention operating in the fundamental frequency mode of flexural vibration, and in every case the vibrator of the present invention is superior to the crystal tuning fork vibrators of the prior art.

The tuning fork crystal vibrator of the present invention operating at the overtone frequency in flexure may be used as the crystal 122 in FIG. 12. It is not necessary to have a special circuit arrangement in the oscillator in order to induce the tuning fork crystal vibrator of the present invention to oscillate at the overtone frequency of flexural vibration. Because the resonant resistance of the torsional mode is usually higher than the resistance of the flexural mode of vibration, this vibrator will oscillate only at the resonant flexural overtone frequency even in a conventional circuit. Thus, the temperature characteristics described in relation to the vibrator per se will be achieved in the oscillator circuit. As discussed above in relation to vibrators operating at the fundamental flexural frequency, the vibrator oscillating at the overtone flexural frequency may be incorporated in any electronic wristwatch without modification of the electronic circuits, especially in those watches where a low power consumption has already been realized.

Although an AT cut crystal vibrator has a good temperature characteristic with respect to frequency, it operates at a frequency in the megahertz range. The vibrator of the present invention in the overtone mode operates in the order of 200 KHZ or some one-tenth of the frequency of the AT cut crystal vibrator. Because the power consumed in the oscillator is approximately proportional to the oscillating frequency, the power consumed by the vibrator of this invention is in the order of one-tenth that consumed by the AT cut crystal vibrator for the same frequency-temperature characteristic. The tuning fork crystal vibrator of the present invention is dimensioned (FIG. 14) such that when the value of the flexural overtone is about 150 to 200 KHZ, as an example, the length l equals 4 to 5 mm, the width w is 0.8 to 1.0 mm, and thickness t is in the range of 140 to 180 microns. This compares with tuning fork crystal vibrators of the prior art having a length l of 6 mm, a width w of 1.5 mm and a thickness t of 500 microns. Other comparative dimensions of this type and disk and rectangular crystal vibrators of the prior art have been presented above.

The manufacturing processes described above and illustrated in FIG. 15 apply equally to the vibrator of this invention designed for operation at the flexural overtone frequency and to the vibrator designed for fundamental frequency operation. However, for the overtone frequency, the quartz plate or wafer is mirror-ground to a thickness of 100 to 200 microns whereas for the vibrator operating at the fundamental flexural frequency, the thickness as described above was 50 to 150 microns. The advantages in using photo-lithography are available in the production of crystal vibrators for operation at the overtone frequency as they were for the vibrators as discussed above operating in the fundamental flexural vibration frequency.

Adjustment in Frequency and Temperature Characteristics

In the text above, quartz-crystal tuning fork vibrators were described which have extraordinarily fine frequency stability relative to temperature variations. This exceptional characteristic is accomplished by cutting the crystal at selected angles relative to the crystal ore axes. Also necessary to the achievement of this temperature characteristic, which has a cubic curvature, is selection of a thickness which provides coupling between the flexural mode of vibration, whether it be a fundamental frequency or overtone mode, and the fundamental torsional mode of vibration. Coupling is effective when the flexural and torsional frequencies are within 15% of each other. However, the tuning fork vibrators are extremely small in size as demonstrated by the dimensional examples presented above. Even small variations in critical dimensions due to manufacturing tolerances can significantly affect not only the frequencies of vibration of the tuning fork vibrator but also the temperature characteristic about the resonant frequency. Hereinafter, modification of the tuning fork vibrators of this invention in order to adjust for manufacturing variances, is described.

FIG. 23 illustrates in perspective a conventional tuning fork vibrator of the prior art, and the directions of the vibrations of the tuning fork arms. Reference numeral 101 indicates the direction of vibrations found in the tuning fork arm at a particular time, and reference numeral 102 shows the direction of vibration of the tuning fork arm after one-half period of oscillation has passed.

Figure 27:
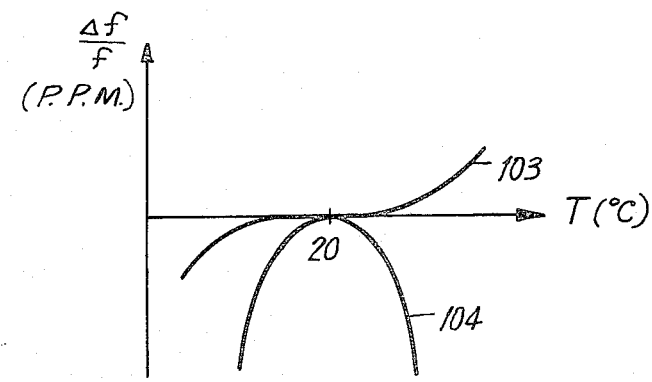
FIG. 27 is a graph similar to FIGS. 3 and 6, showing second- and third-degree temperature characteristics.

The temperature characteristic with respect to the resonant frequency found in this vibrator will show a second degree curve with a turnover point being at room temperature (FIGS. 3, 27). With respect to the Taylor series expansion, equation (4), the second coefficient $\beta$ is minus $35\times10^{-9}/°C.^2$. The prior art vibrator is characterized by a low frequency resulting in low power consumption, thus, it is frequently applied in an electronic wristwatch. However, due to the large variation found in the resonant frequency caused by variations of temperature, as illustrated (FIGS. 3, 27) by the second degree curvature, it is difficult to further improve the accuracy of timekeeping using the prior art vibrators. Therefore, in the prior art the temperature-resonant frequency characteristic of the vibrator is compensated by applying a capacitor having a dielectric which is sensitive to temperature, or a thermosensitive element such as a thermistor may be used in the oscillator circuit. However, it is quite difficult to make a correlation between the characteristic of the vibrator and the characteristic of the thermosensitive element. Accordingly, in the prior art, the accuracy of the vibrator was often worse after compensation than before compensation was applied.

On the other hand, AT cut crystal vibrators have been utilized in place of tuning fork crystal vibrators because the AT cut crystal shows less variation of frequency with respect to temperature near room temperature conditions. However, the AT cut vibrator operates at a high resonant frequency which has the disadvantage of high power consumption and short battery cell life when used in an electronic timepiece. As described above, it is necessary to provide a crystal vibrator having a low frequency of operation and a low variation of the resonant frequency caused by variation in temperature. This characteristic is made possible by coupling two different vibration modes found in the tuning fork crystal vibrator. Such a vibrator is called a mode coupled tuning fork hereinafter and more particularly, when quartz is to be used as the piezo-electric means, this vibrator is called a mode coupled quartz tuning fork. The description which follows is abbreviated where it would substantially repeat material which has been disclosed in the discussions above.

Figure 24:
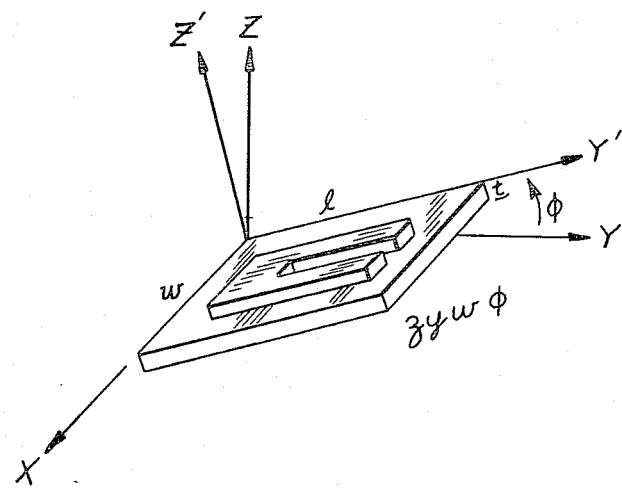
FIG. 24 is a view similar to FIG. 1.

FIG. 24 illustrates the axes used in cutting operations on crystal ore. The X, Y and Z axes show electrical, mechanical and optical axes, respectively. The quartz plate is cut from the crystal ore such that the tuning fork arms are directed along the axis Y' which is determined by rotation of the angle zywϕ around the X axis. The vibrator in the shape of a tuning fork as shown, is provided with the same electrode pattern as shown in FIG. 23. When the electrodes are energized, a flexural vibration is induced in the directions shown in FIG. 23 and indicated by the arrows 101, 102. A torsional vibration is also induced around the longitudinal center lines of the tuning fork arms. Hereinafter, the fundamental vibration frequency in the flexural mode is abbreviated as $F_0$, and the fundamental vibrational frequency of the torsional mode is abbreviated as $T_0$. The resonant frequency of the fundamental vibration $F_0$ is abbreviated as $F_{0f}$, and the resonant frequency of the fundamental torsional vibration is abbreviated as $T_{0f}$. When the flexural resonant frequency $F_{0f}$ is approached in magnitude by the torsional resonant frequency $T_{0f}$, a coupling phenomenon occurs as described above.

Figure 25:
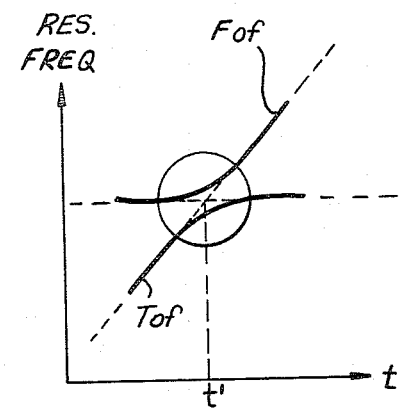
FIG. 25 is a mode-chart similar to FIG. 8 for overtone modes of vibration.
Figure 26:
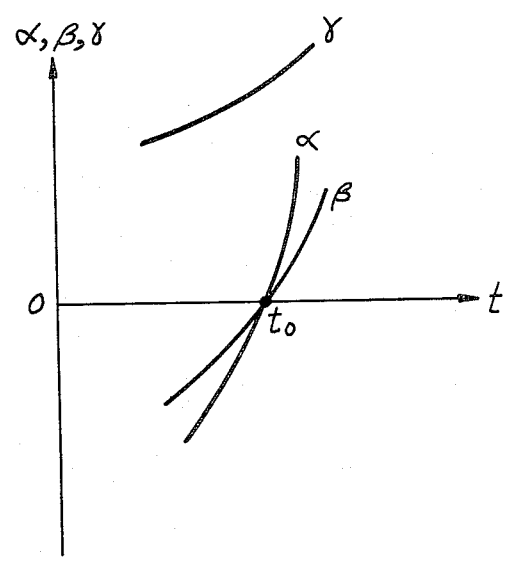
FIG. 26 is a view similar to FIG. 11 for overtone frequencies.

FIG. 25 is a mode chart of coupled frequencies wherein the cutting angle $\psi$ has a value of $\phi_0$, that is, the cutting angle which produces the nominal or desired resonant frequency. The abscissa corresponds to the thickness t of the vibrator and the ordinate axis corresponds to a resonant frequency of the vibrator. The horizontal broken line showing a constant value, that is, a frequency not depending on the thickness t, is the resonant frequency $F_{0f}$ when the flexural and torsional frequencies are not coupled, i.e., a pure flexural frequency. The broken line in FIG. 25 showing the frequency varying linearly against the thickness t of the vibrator is the resonant torsional frequency when that frequency is not coupled to a flexural frequency, that is, a pure torsional frequency. Were it not for coupling, which occurs in the region surrounded by the circle, the two lines $T_{0f}$, $F_{0f}$ could be expected to intersect at a thickness t'. However, as FIG. 25 best illustrates, this intersection does not occur. Instead, as the thickness t increases to approach t', the difference in frequency between the flexural and torsional modes of vibration decreases, and beyond a thickness t', the difference in frequencies again increases. Not only are the resonance frequencies, flexural and torsional, varying as thickness is adjusted, but also the nature of the temperature characteristic with respect to the resonant frequencies varies as the thickness is varied. As a practical matter, a tuning fork crystal vibrator which is thinner than the value of t' has the most favorable temperature characteristics. While the resonant frequencies are changing as shown in FIG. 25, as the thickness t is adjusted, FIG. 26 shows the effect of the thickness adjustment on the parameters which affect the temperature characteristic at those frequencies. In FIG. 26 the cutting angle is $\phi_0$. The ordinate represents the first, second, and third temperature coefficients, $\alpha$, $\beta$, $\gamma$ as derived from the Taylor series expansion of equation (4); the abscissa is crystal thickness t. Curves of $\alpha$, $\beta$, and $\gamma$ represent values of these parameters when the two frequencies, flexural and torsional, are coupled. Although, scaling is not shown in FIG. 26, the order of magnitudes of the coefficients, $\alpha$, $\beta$, and $\gamma$ are $10^{-6}/°C.$, $10^{-8}/°C.^2$ and $10^{-10}/°C.^3$, respectively. As described above, (FIG. 11) and as seen in FIG. 26, there is a crystal thickness $t_0$ where the first and second temperature coefficients $\alpha$, $\beta$ become zero. Thus, the temperature characteristic as represented by the Taylor series expansion, and found empirically, is dominated by the coefficient $\gamma$, and is a cubic function of the temperature. The effect which thickness has upon the temperature characteristic is indicated generally in FIG. 9.

The second degree curve 104 (FIG. 27) indicates the temperature characteristic with respect to the resonant frequency of a prior art tuning fork crystal vibrator which is not cut at the preferred angle. The cubic curve 103 shows the temperature characteristic with respect to the resonant flexural frequency of the mode coupled quartz tuning fork of this invention. The abscissa shows temperature and the ordinate illustrates the ratio of frequency change to the resonant frequency in flexure as defined by Equation (3). The variation of the resonant frequency in the temperature range from 0° to 40° C. is about one-tenth that of a conventional tuning fork crystal vibrator of the prior art. Also, as this is a tuning fork vibrator, the resonant frequency is low, in the order of about 100 KHZ. The curve 103 is applicable when the cutting angle $\phi$ is at the values in the proximity of $\phi_A$ or $\phi_B$ in FIG. 18. More particularly, and only as an example, the value of $\phi$ equals minus 11° and $t_0$ equals 88.5 microns to produce the characteristics where $\alpha$ and $\beta$ are both zero in FIG. 26.

When the mode coupled quartz tuning fork vibrator is used in an electronic wristwatch, the watch has both high accuracy and long battery life since it operates at low frequency with attendant low power consumption. Because the temperature characteristics largely depends upon the thickness t of the vibrator, the temperature characteristics show some dispersion due to the limited dimensional accuracy when vibrators are mass produced. Even small production variances can make the temperature characteristics of the vibrator inferior to the tuning fork vibrators of the prior art. However, as discussed hereinafter, deviations from desired performance due to manufacturing variances can be corrected.

Figure 28:
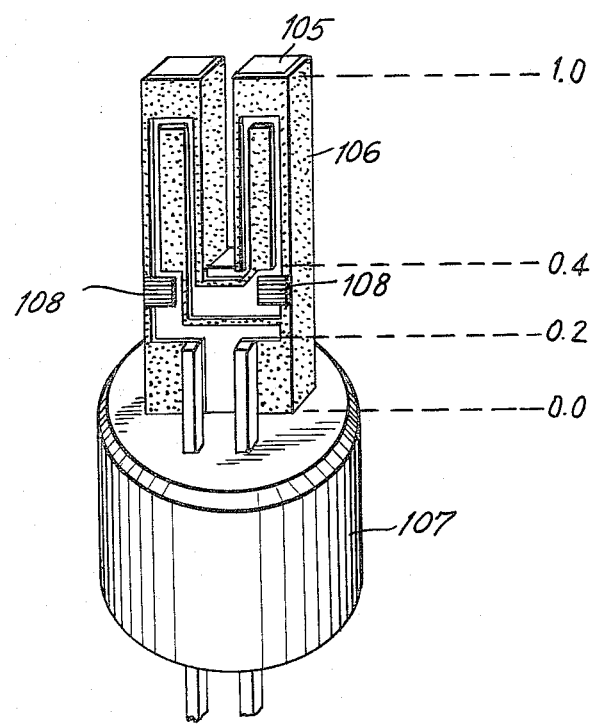
FIG. 28 is a mounted quartz crystal tuning fork vibrator of this invention including weights at the tine bases.

FIG. 28 is a perspective view of a mode coupled quartz crystal tuning fork vibrator of this invention. The main body 105 is covered with a pattern of electrodes 106 and the vibrator is mounted on the plug 107. Weights 108 formed of evaporated silver are located near the base of the tuning fork arms. The temperature-frequency characteristic of this mode coupled quartz tuning fork vibrator corresponds to curve 103 in FIG. 27 as a result of the presence of the evaporated silver weights 108. In the prior art tuning fork crystal vibrators, it has been known to evaporate silver at the end of the tuning fork arms for the purpose of adjusting frequency. However, the use of weights has not been applied to the adjustment of frequency-temperature characteristics.

Figure 29:
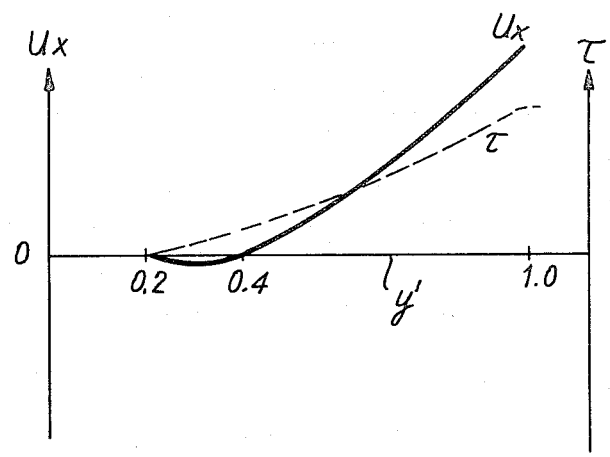
FIG. 29 is a view similar to FIG. 7.

Parameters which can affect the performance of the vibrators of this invention are the cutting angle $\phi$ and the outer dimensions of the vibrator. The effect caused by variations in production of the cutting angles $\phi$ on the temperature characteristic with respect to the resonant flexural frequency is not a practical problem when the variation in cutting angle is limited to less than plus or minus three minutes of arc. It is actually possible to provide such an accuracy of cutting angle $\phi$. With regard to the effect caused by variations in the outer dimensions, the effect of thickness t is the most important among the variations including width w, length l, (FIG. 14), length of the tuning fork arm, width of the tuning fork arm, as well as the thickness t. The effect of variations in width, length, length of tuning fork arm, and the width of the tuning fork arm, is so small in actual production that it is not described herein below. A method for correcting the effects of variations in the crystal thickness t is described below. As stated above, and as illustrated in FIG. 26, at a thickness $t_0$, the vibrator of this invention has the superior cubic temperature characteristic. When due to production variances, the thickness t equals the value of $t_0 + \Delta t$, the first and second temperature coefficients, $\alpha$, $\beta$ will have positive values. Thus, it is necessary to make these coefficients zero if the desired temperature characteristic is to be achieved for that overly thick crystal vibrator. FIG. 29 shows the mechanical displacement Ux of the flexural mode of vibration, that is, in the direction of the X axis in the tuning fork vibrator of this invention. The torsional, angular displacement $\tau$ of the torsional mode of vibration of the vibrator arms is also shown. The ordinate scales represent the linear displacements Ux and the angular displacement $\tau$; the abscissa shows longitudinal positions along the crystal vibrator measured in the direction y'. The value 1.0 represents the far, free end of the tuning fork arms. The base of the tuning fork vibrator is designated as 0 and the end of the plug prongs (FIG. 28) is at the point 0.2 on the vibrator. The base of the tuning fork arm, that is the root portion of the tines, is at a position corresponding to 0.4. The displacement Ux of the flexural frequency has a nodal point near the root portion of the tines at approximately 0.4. The torsional deflection $\tau$ of the torsional frequency has no nodal point in the range of positions from 0.2 to 1.0. Thus, when a weight is added near the root of the tines where there is little or no displacement, the value of the flexural resonant frequency is scarcely altered, however, the value of the torsional frequency is decreased. This occurs because the displacement Ux is zero at that point while the torsional angle is not zero. Thus, only an existing displacement may be dampened by the addition of weight.

Figure 30:
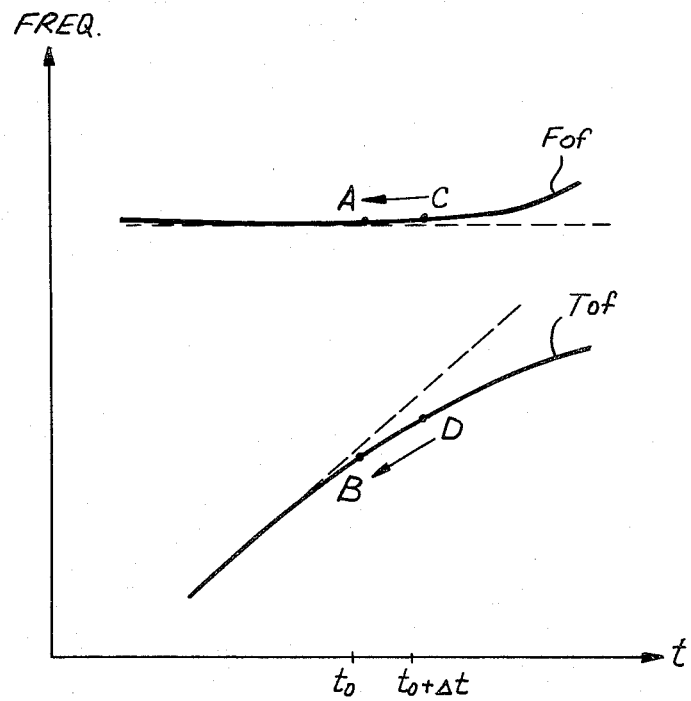
FIG. 30 is a frequency-temperature characteristic showing the effect on flexural and torsional frequencies of the addition of weight to the root of the tines of a tuning fork vibrator of this invention.

FIG. 30 is a graph similar to FIG. 25 showing a portion of the frequency-thickness characteristic in the coupled region. The upper curve $F_0f$ shows the resonant frequency of flexural vibration as the vibrator thickness is varied. The lower curve $T_0f$ shows how the resonant torsional frequency is varied. The thickness $t_0$ represents the thickness which would produce the desired fundamental flexural resonant frequency A from the crystal vibrator if there were no variations in manufacturing. When the thickness t corresponds to the value of $t_0 + \Delta t$, the values of $F_0f$ and $T_0f$ correspond to the points C and D respectively rather than to the desired points A and B, respectively. Not only do the frequencies differ from the desired values occurring at $t_0$, but also the coefficients $\alpha$, $\beta$, $\gamma$ as used in Equation (4) differ from those values which produce the most favorable cubic temperature-frequency characteristics. This condition has been discussed above with reference to FIG. 9.

The following is a description of means for restoring the desired frequency and temperature characteristics. The value of torsional frequency which is too high can be dampened from the point D to the point B by the addition of weight near the root portion of the tine. Thereby, the frequency of flexural vibration $F_0f$ is only varied slightly from point C to point A. Thus, it is possible to recreate the condition where the values of $F_0f$ and $T_0f$ are coincident with those which could be obtained when the thickness equals the desired value $t_0$. Further, in making this adjustment to the frequencies, the first and second coefficients, $\alpha$, $\beta$ of $F_0f$ are set to zero whereby the desired cubic temperature characteristic is achieved. Thus, the curves of FIG. 30 indicate that a variance in thickness on the positive side may be adjusted by the addition of a small mass 108, (FIG. 28) near the root portions of the tines. Practical experience indicates that corrections to a frequency are best accomplished from a thickness slightly thicker than $t_0$ shown in FIG. 30, and produce the most desirable temperature frequency characteristics. Simply stated, the frequency of a crystal which has been cut too thick can be adjusted by the addition of weight. Where the variance from the desired frequency is substantial in the torsional mode of vibration and minimal in the flexural mode of vibration, the adjustment can be made by the addition of weight near the nodal point of flexural vibration. This nodal point is near the root of the tines when the mode of flexural vibration is a fundamental mode.

After the grinding has been performed, if the thickness t is less than the desired $t_0$ for the crystal plate, that is, $t = t_0 - \Delta t'$ where delta t' is approximately zero, the first and second temperature coefficients $\alpha$, $\beta$ of the fundamental flexural frequency are negative (FIG. 26). To achieve the desired cubic temperature-frequency characteristic, it is required to make these coefficients approach zero. As seen in FIG. 30, a thickness slightly less than $t_0$ will not substantially affect the flexural frequency of vibration, however, the torsional frequency could be increased without causing any change in value of the flexural frequency. However, this is difficult to accomplish. Thus, when t is less than $t_0$, the vibrator is used at a lower frequency which is on the extension of the line between points C and A of FIg. 30. The flexural frequency is thus a little lower and this condition is achieved by changing the mass which is added to the tines at points other than the nodal points of flexural vibration. With reference to FIG. 29, because displacement Ux of the flexural frequency at the free end of the tuning fork arms is not zero, and the torsional angle $\tau$ at the free end is not zero, the values of the flexural resonant frequency and the torsional resonant frequency are both decreased as weight is added to the far free end of the tuning fork arms.

When a proper weight is applied to the free end of a tuning fork arm, the first and second temperature coefficients $\alpha$, $\beta$, for the flexural frequency are substantially equal to zero. Further, it is possible to correct the thickness to adjust the frequency. These techniques are effective when the flexural torsional frequencies are coupled as described above.

Figure 31:
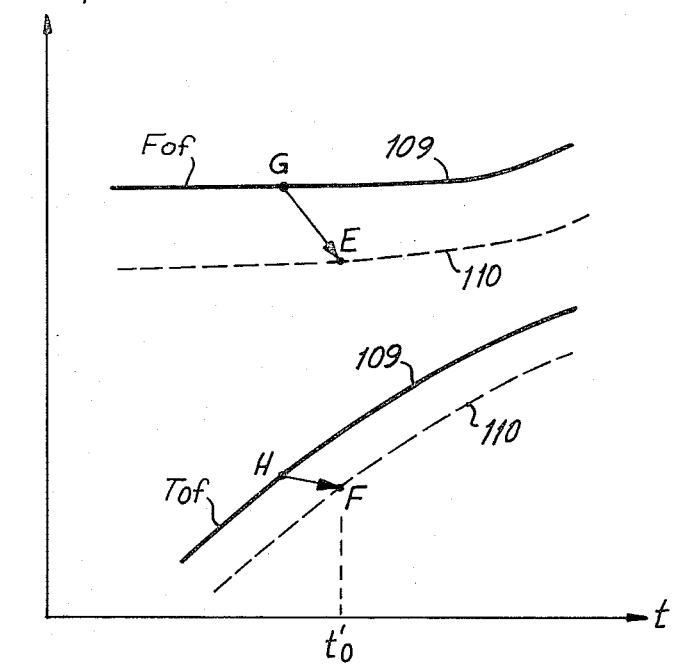
FIG. 31 is a frequency-temperature graph showing the effect on flexural and torsional frequencies of the addition of weight at the end of the tines of a tuning fork crystal vibrator of this invention.

FIG. 31 illustrates the effects on the flexural resonant frequency and the torsional resonant frequency before and after the weight is added to the far end of the tuning fork arm. The abscissa corresponds to crystal thickness t and the ordinate axis corresponds to the resonant frequencies. The curves 109 indicate values of $F_of$ and $T_of$ when the cutting angle $\phi$ corresponds to an angle of $\phi_o$. The curves 110 in broken lines indicate values of the coupled flexural resonant frequency and torsional resonant frequency when the cutting angle $\phi = \phi_o + \Delta\psi$. It can be seen that a greater cutting angle has the effect of depressing the level of vibration in both modes. When a weight is added at the ends of the tines of a crystal vibrator having resonant frequencies indicated at the point G and H, the torsional frequency changes to a value indicated at F and the flexural frequency changes to a value indicated at E. The effect of adding the weight is the same as though the crystal had originally been cut to an angle corresponding to $\phi_o + \Delta\psi$ with a thickness corresponding to $t_o'$. The first and second temperature coefficients $\alpha$, $\beta$ of the resonant flexural frequency still remain substantially zero after the weight has been added because the $\Delta$ value is small, that is, the first and second coefficients $\alpha$, $\beta$ approach zero not only when the cutting angle corresponds to $\phi_o$ and the thickness corresponds to $t_o$, but also when the cutting angle is $\phi_o + \Delta\psi$. The two groups of curves 109, 110 are shown widely spaced in FIG. 31 only for the sake of clarity in illustration. In actuality, the curves are close together. The same effect of applying single weights on the free ends of the tuning fork arms may be achieved by adding other weights not only to the free ends of the arms but also to vibrating parts other than the nodal points along the tuning fork arms. The effect of the weight varies with its position and magnitude. In such a case the temperature coefficients $\alpha$, $\beta$ are substantially zero when the frequency has been adjusted to the desired value and the physical variations are small.

It is also possible to use weights for adjusting the overtone frequency of the flexural vibration instead of the fundamental frequency $F_of$. The first overtone of the flexural vibration frequency is designated as $F_1$ and the resonant frequency is designated $F_1f$ hereinbelow. When $F_1$, the overtone, is used in place of $F_o$, the fundamental, the oscillation frequency for the vibrator is approximately 200 KHZ. Therefore, current consumption increases about two times over that of the vibrator using the fundamental frequency $F_o$. However, there are advantages and the overtone frequency is sometimes utilized. One advantage is that little aging variation occurs in the resonant overtone frequency because of a high value of Q. Another advantage is that little variation in frequency occurs as a function of the direction of gravity which is applied to the vibrator.

When the overtone flexural frequency is used instead of the fundamental frequency, it is also possible to have a temperature characteristic with respect to the resonant overtone frequency as is shown by the curve 103 (FIG. 27). At a suitable cutting angle $\phi$ and thickness $t_1$, there is produced a desired cubic function of temperature.

However, as with the fundamental frequency, the value of the resonant overtone frequency will vary due to limitations in the accuracy of manufacture of the crystal materials. The concepts for correcting this frequency dispersion are the same as those which are applied to correct values of flexural frequency. The thickness $t$ is the most important parameter influencing the temperature characteristic whether one is concerned with the fundamental flexural frequency of vibration or the overtone flexural frequency of vibration.

Figure 32:
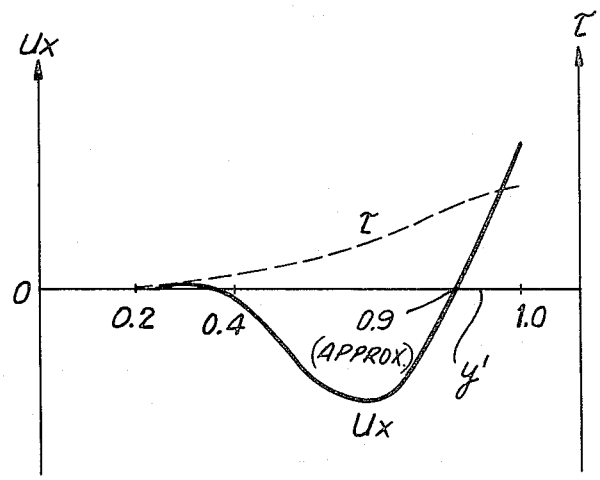
FIG. 32 is a graph similar to FIG. 20, showing deflections, including overtone frequencies.

FIG. 32 shows the flexural displacements Ux of the first overtone frequency, and the torsional deflection angles of the fundamental torsional frequency. The lengthwise extent of the tuning fork arm is in the y' direction (FIG. 24) which is the abscissa of the diagram. The free end of the arms is indicated at 1.0. The base end of the tuning fork is set at zero (0). The root portion of the tine is at 0.4 and the end of the supporting rods (FIG. 28) is at 0.2. It can be seen that the displacement Ux of the overtone frequency has nodal points both at the root portion of the tine, that is, near the 0.4 position, and also at a position of approximately 0.9. The torsional angle $\tau$ of the fundamental torsional frequency $T_o$ had no nodal points in the range of positions from 0.2 to 1.0. In a manner similar to that described above, when the crystal due to manufacturing variances is too thick, that is, in excess of the most suitable thickness $t_1$, it is possible to adjust the frequency, and temperature coefficients $\alpha$, $\beta$ for the overtone frequency $F_1f$ to approximately zero by adding a weight to the nodal point of displacement Ux at the root portion of the tine (0.4) or at a position approximately 0.9. It is also possible to add weight to both of these nodal points. The effect of each weight is determined by its position and magnitude. Similarly, when the crystal, due to manufacturing variances, is thinner than the most suitable thickness $t_1$, adjustment in frequency is made by adding weight at one or two positions other than the nodal points of vibration to correct both flexural and torsional vibrations. Thus, the corrections to the flexural overtone frequency are similar to the corrections made for the flexural fundamental frequency. However, when overtones higher than the second overtones are used, the nodal points are increased to more than three. It is simple in such a case that the weight be added to one of the nodal points to correct torsional frequency. Also, when an overtone greater than the first overtone is used, weights may be added to two or more nodal points to adjust frequency. Correction may be accomplish by adding a weight at places other than the nodal points when flexural frequency needs adjustment.

When temperature characteristic of the resonant flexural overtone frequency and the resonant fundamental frequency are corrected by the methods described above, the resultant values of the overtone and fundamentals frequencies may be different from a preselected specified value. Conventional tuning fork crystal type vibrators are adjusted to a specified frequency when the crystal vibrator is used in an electronic wristwatch. Thus, it is only necessary to divide the frequency using flipflop circuits when using the adjusted conventional tuning fork crystal vibrator. When the mode coupled quartz crystal tuning fork vibrator of this invention is used wherein the fundamental and overtone frequencies have been adjusted for a desirable temperature characteristic so that the actual frequency is not the preselected frequency, it is not possible merely to divide the frequency by a flipflop circuit.

Figure 45:
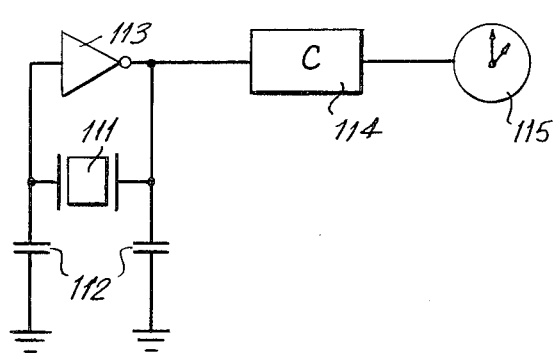
FIG. 45 is a block diagram of an electronic timepiece using the quartz crystal tuning fork vibrator of this invention.

FIG. 45 shows the circuit block diagram of an electronic wristwatch using a weighted mode coupled quartz tuning fork crystal vibrator 111 of this invention. The oscillator circuit includes capacitors 112, a complimentary MOS inverter 113, and a counter 114 using a non-volatile memory (not shown). The time display device 115 operates from the output of the counter 114 in the known manner. Since the resonant resistance of the torsional frequency is very much higher than the values of resistance to the fundamental and overtone flexural frequencies, it is simple to induce oscillation in the circuit for the fundamental and overtone flexural frequencies without inducing the torsional vibration. This is also true for the second overtones of flexural vibration. The vibrator of the present invention is applied to the electronic wristwatch by feeding out one pulse from the counter 114 to the time display device 115 when the oscillation frequency of the oscillator circuit, including the quartz tuning fork 111, is stored as a number in the counter 114 using the nonvolatile memory. The pulses are fed out each time the same number of cycles received in the counter 114 from the oscillator coincides with the number stored in memory. The wristwatch using the mode coupled quartz crystal tuning vibrator of the present invention has a high accuracy, and a long life because of low power consumption.

In one preferred embodiment of the present invention, evaporated silver is used as the weight applied to the tuning fork arms but it is also possible to apply other metals and coatings, and the weight may be diposited by techniques other than vacuum evaporation. Also materials other than metals which can be physically attached as weights may be used. Weight which has already been applied to a vibrator may be removed by a laser beam in the known manner. In the above description, a quartz crystal has been used as the piezoelectric means however, other piezoelectric materials can also be used and the tuning fork vibrator may be formed of metals.

As described, the temperature characteristic with respect to the resonant frequency of flexural vibration is modified by increasing or decreasing the weight of the tuning fork arms of a vibrator which is coupled with respect to the flexural vibration and the torsional vibration of the arms. The concepts presented herein may also be applied to quartz tuning forks that are coupled by means of other vibrational modes.

Amplification on the adjustment concepts and the adjusted design, described above, follows.

FIG. 33 illustrates in perspective a conventional prior art tuning fork crystal vibrator and the directions of flexural vibration of the tuning fork arms. The direction of deflection 161 occurs at a certain time and the direction of deflection 162 occurs after one-half of the period of oscillation has passed. As stated previously, the temperature-frequency characteristic of the prior art vibrator corresponds to a second degree curve having its turnover point at room temperature. This vibrator consumes little power because of its low operating frequency and thus is frequently used in electronic wristwatches. However, the effect on frequency due to variation in temperature is significant so that it is difficult to provide an accurate timepiece. The problems previously discussed associated with high frequency, aging, and attitude of mounting, are overcome in the mode coupled tuning fork crystal vibrator of this invention wherein several vibration modes are coupled. The temperature characteristic with respect to the resonant frequency of a coupled tuning fork crystal vibrator depends upon the cutting angle $\phi$ and the outer dimensions of the vibrator. Of greatest importance are the external dimensions. When the vibrator is mass produced, the temperature characteristic with respect to resonant frequency is varied by the dimensional variations in the working material. Variations in the cutting angle $\phi$ do not provide any practical problem if the error in angle is less than plus or minus three minutes of arc, and it is possible in production to provide such accuracy in the cutting angle $\phi$. Thus, it is variations in the external dimensions which must be corrected in order to achieve the desired cubic temperature characteristics. This is true not only of the mode coupled quartz tuning fork but also of any mode coupled tuning fork.

FIG. 34 illustrates in perspective a coupled tuning fork crystal vibrator as one practical example of the present invention. A main body 165 of the coupled tuning fork vibrator has electrodes 166, a plug 167, weights 168, for example, silver evaporated on the end of the tuning fork arm, and weights 169 placed near the root of the tuning fork arms. Weights 169 may also be of silver. When the vibrator is perfectly formed, that is when the cutting angle $\phi$ corresponds to $\phi_o$, length (FIG. 14) is $l_o$, width is $w_o$, length of the tuning fork arm is $l'_o$, width of the tuning fork arm is $w'_o$, and the thickness is $t_o$, the variation in flexural vibration frequency caused by a variation in temperature is the least and follows a desired cubic pattern. Also, the value of the resonant flexural frequency, $F_o f$ is coincident without any adjustment with the specified value for the vibrator. However, as a practical matter both the temperature characteristic at the resonant flexural frequency and the absolute value of the flexural resonant frequency are varied by variations found in production in the cutting angle and the outer dimensions. In order to correct these variations in temperature characteristic and in the resonant flexural frequency, the silver weights 168, 169 are deposited by evaporation on the tuning fork arms.

Figure 35:
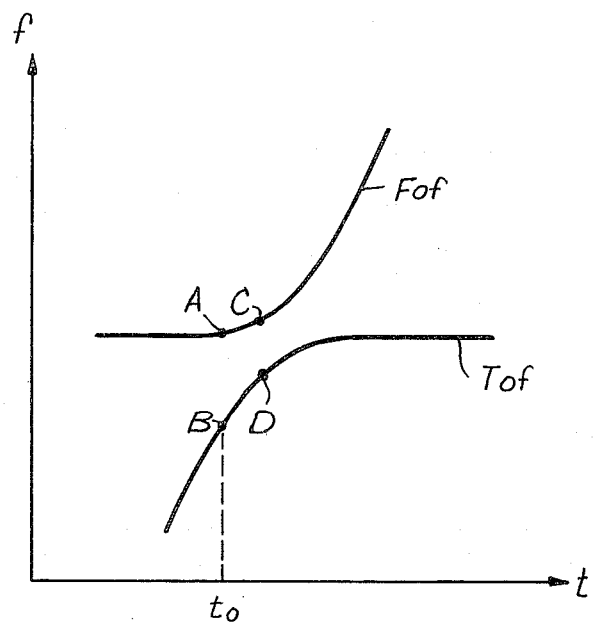
FIG. 35 shows the coupled frequency-thickness characteristics of the tuning fork crystal vibrator of this invention.

The curves in FIG. 35 show the flexural resonant frequency $F_o f$ and the torsional resonant frequency $T_o f$ when the cutting angle is precisely $\phi_o$ and the other dimensions expecting thickness are precisely as specified. The curves show the effect on frequency, the ordinate, of variations in thickness t. The value of thickness $t_o$ is the thickness which gives the least variation in the fundamental resonant flexural frequency due to variations in temperature and this condition is represented by points A, B on the flexural and torsional frequency curves respectively. Also, the value of flexural resonant frequency at A coincides with the nominal specified values of frequency for the vibrator. Thus, in this instance, it is not necessary to adjust the temperature characteristic of $F_o f$ and the actual value of flexural frequency coincides with the nominal specified value of frequency for the vibrator.

However, for the purpose of illustrating the concepts of this invention, it is assumed that the cutting angle $\phi$ and all of the external dimensions are displaced in manufacture by a small amount from their intended values. Further, assume that due to these production variations, the value of the flexural resonant frequency $F_o f$ is at point C in FIG. 35, and the value of the torsional resonant frequency $T_o f$ is at point D in FIG. 35. Because of these parametric variations, the temperature frequency characteristic for the flexural resonant frequency is deteriorated, that is, it deviates from the preferred cubic curve. Also, the absolute value of the flexural resonant frequency $F_o f$ is displaced from the nominal specified value. It is found that if the frequency of resonance can be adjusted to equal the frequencies in flexural and torsional vibration found in the ideally cut crystal, namely, at points A, B as indicated on the curves of FIG. 35, then, the modified crystal vibrator of this invention will take on substantially the temperature frequency characteristics of the ideal cut crystal having the precise dimensions of $t_o$, $\phi_o$, $l_o$, $l'_o$, $w_o$, $w'_o$ stated above. It is thus possible to have the desirable cubic temperature characteristic as well as a resonant frequency in flexural vibration at the nominal value.

FIG. 29 illustrates the distributions of displacements Ux in the direction of the X axis for the resonant flexural fundamental frequency plotted against the longitudinal direction y' of the tuning fork arm. As stated above, the torsional angle $\tau$ of the torsional frequency of vibration is also shown. Again, zero (0) indicates the base of the vibrator and 1.0 indicates the free end of the tuning fork arms. The position 0.4 corresponds to the roots of the tuning fork arms. It should be noted that there are vibrational displacements even below the roots of the tuning fork arms. For a fundamental flexural frequency of vibration $F_o$, there is a nodal point located near the base of the tuning fork tine, that is, at approximately 0.4. Generally speaking, in a vibrator, when a weight is added at a point where there exists a displacement in vibration, i.e., it is not a nodal point, the resonant frequency is decreased. Thus, when a weight is added in a region near the free end of the tuning fork arm, that is, position 1.0, the resonant frequency of both vibrations is decreased because Ux and $\tau$ are not zero at the free end. In turn, when the weight is added to the nodal point near the base of the tuning fork arms, that is, at approximately 0.4, the resonant frequency of the flexural fundamental is barely varied because the value of displacement Ux is normally zero at that point. However, the resonant frequency of the torsional fundamental is decreased because the value of torsional displacement $\tau$ is not zero.

It would not be precisely accurate to say that positioning a weight at the nodal point of the flexural vibration causes no change in the resonant frequency of flexural vibration. Although it has not been shown or discussed previously, there will be some deflections in the Y axis direction as well as the X axis direction for a fundamental flexural frequency, so that by adding a weight at the nodal point of the X displacement there will certainly be some slight variation in the resonant frequency due to the Y axis effects. However, the change in the resonant flexural frequency is extremely small when compared to the change produced in the resonant torsional frequency $T_o$ when a weight is added to the nodal point of the X displacement in flexure.

Thus, in order to modify the values (FIG. 35) of the resonant frequency at the points C and D so as to coincide with the resonant frequencies at the points A and B, respectively, a weight is added as a first step near the free end of the tuning fork arms such that the resonant frequency at point C is modified to coincide with the resonant frequency at point A. Because there is also a deflection in torsion near the end of the tuning fork arm, the addition of weight at that point will not only modify the flexural frequency but also the torsional frequency. The torsional frequency moves from the point D in the direction of point B on the curve of FIG. 35. Then, as a second step, a weight is added near the nodal point at the base of the tuning fork arms, and thereby the resonant frequency in torsion is modified to coincide with the resonant frequency at the point B. In accomplishing the second step, the resonant frequency of flexure is barely altered because the weight has been added at the nodal point of flexural vibration. As stated above, when both frequencies have been adjusted to those values associated with the ideally cut coupled quartz tuning fork vibrator of this invention, namely having a cutting angle $\phi_o$ and a thickness $t_o$ along with the other external dimensions as defined above, the frequency-temperature characteristic is substantially the cubic curve associated with the perfectly cut crystal vibrator.

A preferred embodiment of the present invention has been described wherein weights are placed at the far end of the tines and near the base of the tines. Similar effects may be accomplished in other alternative embodiments of this invention where weights are added to other positions in place of, or in addition to, the positions described above. For example, the weight can be added to the tines at any point along the length where there is a deflection for both vibrational frequencies. This accomplishes the first step of the procedure, and it should be apparent that a weight placed at a point away from the free end will have less effect on the resonant frequencies than a weight placed at the very end for the fundamental modes. Thus, for example, it is also possible to add a weight along the central portion of the tuning fork arms and also to the nodal point near the base of the arms. Also, in another alternative embodiment, it is possible to add the weight near the central portion of the tuning fork arms and then to add a weight to the nodal point when it is found that weights added only at the free end of the tuning fork do not provide the desired effects. Still further, it is possible to provide the desired frequency adjusting effect without adding weight at the nodal point near the base of the tuning fork arms in some instances. The desired result is accomplished regardless of how and where the weights are added when the resonant frequencies move to the desired values at A and B. So in some instances, even one weight may be sufficient. As stated previously, the position and magnitude of the weight determines how much effect that weight will have in varying the resonant frequencies.

In order to readily correct for variations occurring in mass production, the values of the frequencies before adjustment by the addition of weight should be higher than the desired value of flexural and torsional frequency which occur when the crystal is cut at the perfect angle and is perfectly dimensioned. Therefore, it is necessary to make the thickness t a little larger in mass production then that of the most suitable thickness, or to make the length of the tuning fork arm in mass production a little shorter than the most suitable length for the arm. In practice, it is found that thickness t should be increased by less than 1% of the optimum thickness of the vibrator. For example, where a thickness of 88.5 microns is most suitable for a fundamental vibration in flexure, the thickness is increased in production by less than 0.8 microns. When decreasing the arm length, length is reduced by less than 0.1% of the optimum length, that is, 1.6 microns on an arm of 1670 microns. Such adjustments in dimensions are determined by the amount of frequency adjustment which is produced by the deposition in weight. As stated previously, the weights are deposited by vacuum evaporation or sputtering process.

When the tuning fork arm length is a little less than the optimum length, or when the thickness is a little greater than the optimum thickness, the resonant frequencies are higher than the nominally selected frequencies and these frequencies are downwardly adjustable by the addition of weight as described above. It should also be apparent from the above discussion and the Figures, that removal of weight by any means will allow adjustment of frequencies in the opposite directions in accordance with the principles described above wherein adjustment of weight at certain points will affect both torsional and flexural resonant frequencies whereas adjustment at other points will affect only the torsional frequencies.

Figure 36:
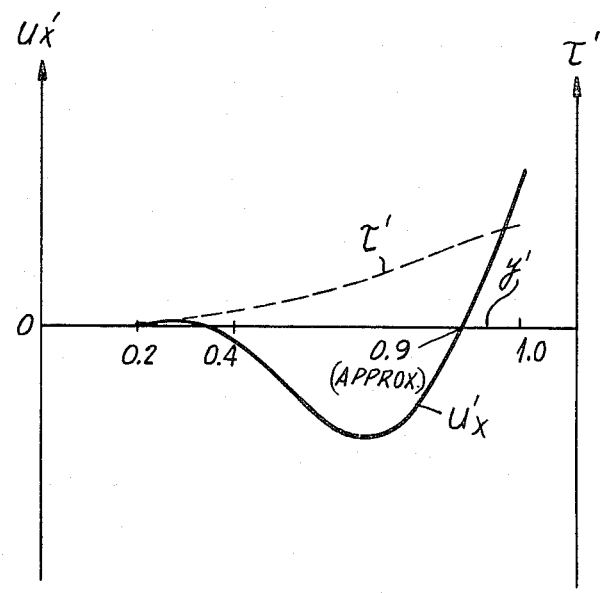
FIG. 36 is a graph of torsional and flexural deflections in the tuning fork vibrator operating in an overtone mode.
Figure 46:
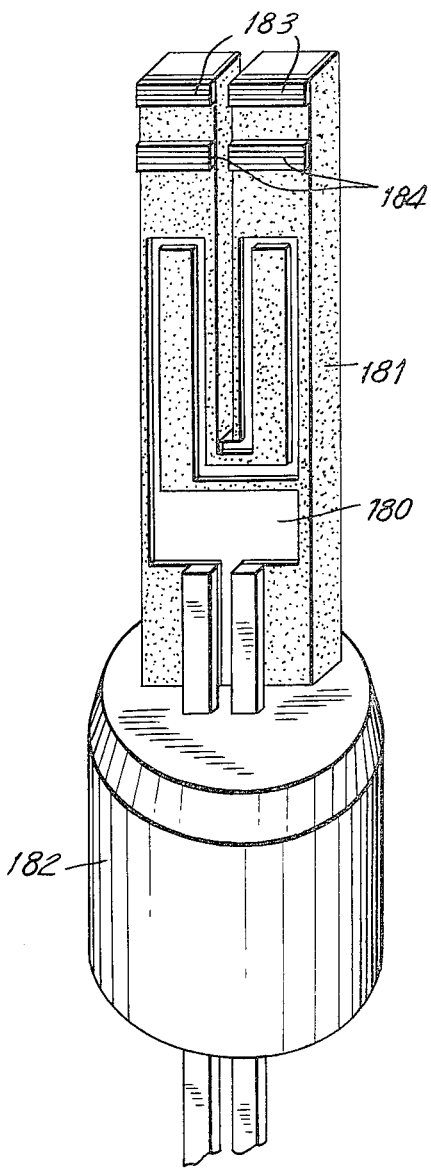
FIG. 46 is a quartz crystal tuning fork vibrator of this invention with weights added to modify the frequency-temperature characteristics.

FIG. 46 shows another alternative embodiment of this invention. The tuning fork vibrator 180 includes a pattern of electrodes 181 on the surfaces thereof, a plug 182 and weights 183, 184, for example, deposited by vacuum evaporation, at and near the free end of the tuning fork arms. This vibrator is designed to operate when the overtone of the flexural vibration frequency is coupled to the fundamental of the torsional vibration frequency. The principles used in locating the position of the weights is similar to those described above where the fundamental flexural frequency was considered as coupled to the fundamental torsional frequency. In FIG. 36, the distribution of displacements of the tuning fork arm in the X direction is indicated as Ux'. The torsional displacement is indicated as $\tau'$, and both displacements are indicated on an abscissa measured in the direction of the Y' axis of the tuning fork arms. As before, 1.0 on the abscissa represents the free end of the tuning fork arms; 0.4 represents the base of the tuning fork arms; zero (0) is the other end of the tuning fork; and 0.2 represents the end of the leads extending to the plug 182. Components of vibrational displacement exist below the base of the tuning fork arms and nodal points in the flexural displacement are present near the base of the tuning fork arms, that is, at approximately 0.4, and near a position approximating 0.9. In FIG. 46, the weight 183 of silver is located near the free end at approximately position 1.0, and the other similar weight 184 is located near the position 0.9. In comparison with the embodiment of FIG. 34, the silver weight 183 corresponds to the silver weight 168 in that both weights are on the free ends of the tuning fork arms where there are both flexural and torsional displacements. The silver weight 184 corresponds to the silver weight 169 in that both weights are positioned at nodal points in the flexural displacement curve.

As explained more fully hereinafter, the addition of the weight 183 is used to adjust a variant overtone flexural frequency until it coincides with the most desirable value of overtone flexural frequency. Then, by adding the silver weight 184, the variant value of torsional frequency is adjusted to the most suitable value of torsional frequency. Thus, a tuning fork vibrator of the mode coupled type according to this invention is made after correcting manufacturing variances so that both the operating frequency and the frequency-temperature characteristic are adjusted to the desired values including the cubic frequency-temperature characteristic.

It should also be apparent that it is possible to correct a vibrator operating with an overtone flexural frequency by adding weights in the region of the free end of the tuning fork arm and to the other nodal point near the base of the tuning fork at position 0.4. It should also be apparent that many other combinations of weight are possible to correct the overtone vibrator which has manufacturing variances in its dimensions. For example, weights can be added in the region of the nodal point of 0.9 and along the tuning fork arm at points other than the free end or the other nodal point. Weights may also be distributed so that they are located at the two nodal points as well as the other points where the displacements are not zero. The concepts of adding weights at nodal and non-nodal points on the tuning fork vibrator, as described above, are also applicable for higher orders of overtone frequencies, and these concepts are also applicable to vibrator modes other than flexural vibrations in the X direction and torsional vibrations about the axis of the tuning fork arms as described above.

To summarize the discussion of frequency adjustment to this point, in a tuning fork vibrator having coupled different vibration modes, it is possible to correct for variations, due to mass production techniques, found in the cutting angle and outer dimensions of the vibrators. This is accomplished by initially making the thickness of the vibrator a little greater than the most suitable thickness for the desired frequencies or making the length a little less than nominal. Then the actual characteristics of the vibrator are adjusted to the desired frequencies by the addition or removal of weights at selected locations on the vibrator. Thus, it is possible to realize the electronic wristwatch which has high accuracy and long operating life by using a mode coupled quartz tuning fork vibrator of this invention.

Mode coupling has been performed where the overtone of the flexural vibration was a frequency six times greater than the resonant frequency of the fundamental vibration of flexural vibration. Nevertheless, the coupling phenomenon occurs when the fundamental torsional vibration approaches the overtone frequency as discussed above.

Figure 37:
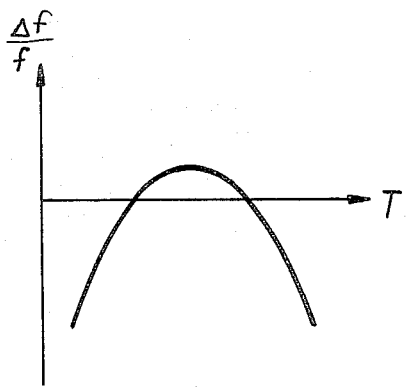
FIG. 37 is a vibrator frequency-temperature characteristic of the second degree.
Figure 38:
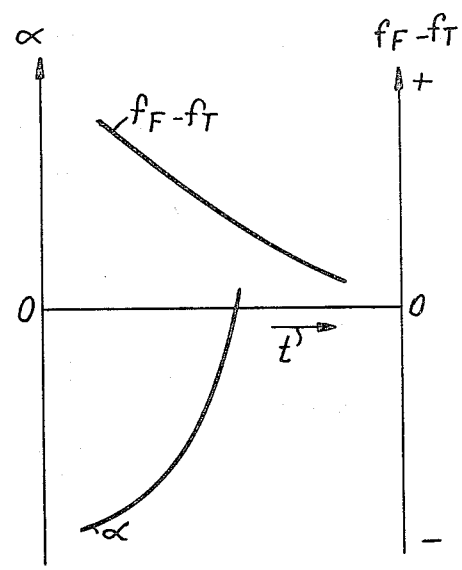
FIG. 38 is a graph showing the effect of crystal thickness on the vibration frequencies and temperature parameters of the crystal vibrator of this invention.
Figure 39:
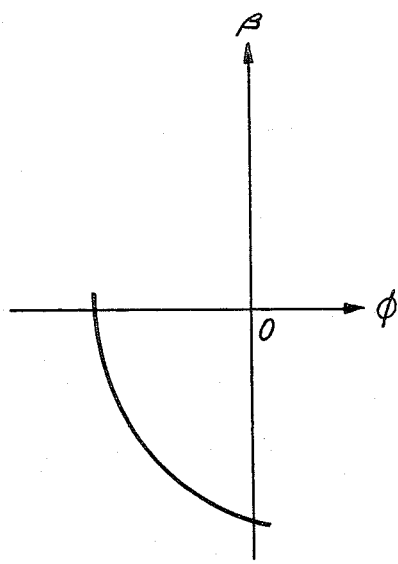
FIG. 39 is a graph illustrating the effect of crystal cutting angle on a parameter affecting the temperature characteristic of the vibrator.
Figure 40:
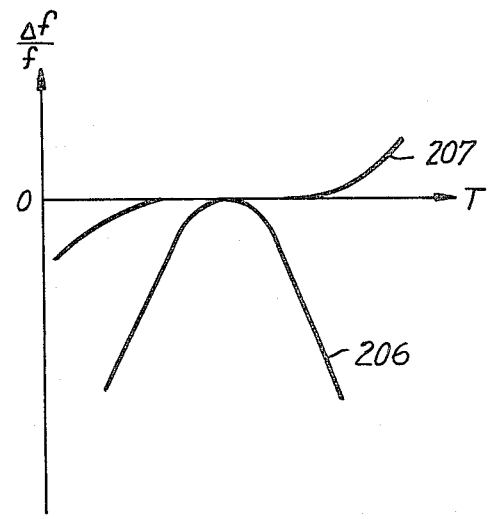
FIG. 40 is a graph showing the effects of cutting angle and thickness on the frequency-temperature characteristic as compared to a conventionally cut crystal vibrator.

FIG. 38 illustrates the effect of crystal thickness on certain characteristics of performance. The difference between the resonant frequency of the first overtone fF and the fundamental frequency of torsional vibration fT, that is, fF−fT, is shown as a function of thickness. As the mode charts, for example, FIG. 35, show, the difference in frequencies diminishes as the thickness increases in a certain region of thickness. Also, for the flexural overtone the first temperature coefficient in Equation (4), that is, $\alpha$, varies rapidly as t changes in very small amounts. FIG. 39 illustrates the second temperature coefficient, $\beta$, of the first overtone of the flexural vibration with respect to the crystal cutting angle $\phi$. It is apparent from FIGS. 38 and 39 that there is a combination of thickness and cutting angle where both temperature coefficients, $\alpha$ and $\beta$, of the first overtone of flexural vibration are zero. At that time, the temperature-frequency characteristic is in the cubic form, as illustrated in FIG. 40 by curve 207. This is a much more favorable temperature characteristic than the temperature-frequency characteristic found in the conventional prior art tuning fork vibrators as illustrated in FIG. 37 and by curve 206 of FIG. 40. The variation for the coupled crystal tuning fork vibrator of this invention in the range of 0° C. to 40° C. is about 1/10 of that of the conventional prior art tuning fork vibrator in the same temperature range. FIGS. 38 and 39 represent a crystal having the first temperature coefficient $\alpha$ equal to zero at a thickness of 158 microns when the crystal is cut at an angle $\phi = -12.5$ degrees (zyw−12.5°). At that condition, $\beta$ is also zero.

Figure 41:
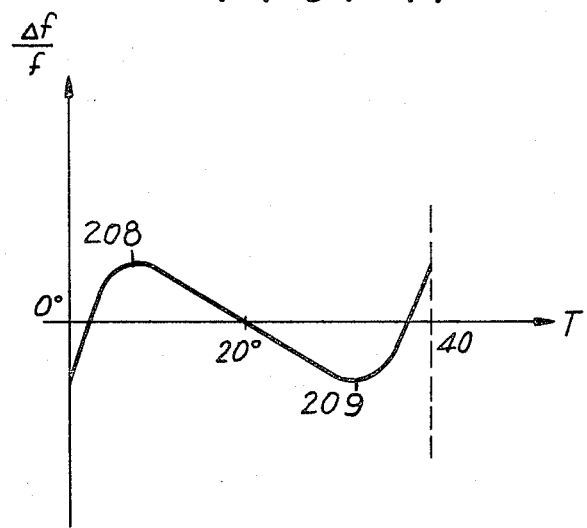
FIG. 41 is a novel frequency-temperature characteristic of a tuning fork crystal vibrator of this invention having weights added to modify frequency-temperature characteristics.

The nature of the mathematical Equation (4) suggests that other temperature characteristics are possible if in fact the characteristic is truly represented by the Taylor expansions. In fact, an improved temperature characteristic, as illustrated in FIG. 41, is achieved when $\beta = $ zero and $\alpha$ approximately equals $-300\gamma$; then the points of inflection 208, 209 occur at approximately 0° and 40° C., respectively. Also, for a watch intended to operate at low temperatures, it has been found that a favorable characteristic is produced when $\beta$ is approximately equal to $15\gamma$, and $\alpha$ is approximately equal to $-300\gamma$.

Thus, specific temperature characteristic requirements can be met by setting the values of $\alpha$ and $\beta$ in relation to the values of $\gamma$.

As indicated above, thickness is among the most important parameters in the design of a tuning fork coupled vibrator of this invention, and thickness variations less than 0.1 microns are significant. Thus, it is virtually impossible to provide an absolute control over thickness during the crystal-polishing operations. It is possible to measure each crystal one by one and provide control over thickness by an etching operation, but this is not economical and results in a low percentage of conforming articles. The vibrators of this invention as described above are made economically.

With reference to FIG. 30, it was stated that the addition of a weight near the root of the tuning fork arms would adjust both the flexural frequency from point C to point A while simultaneously adjusting the torsional frequency from point D to point B, such that characteristics equivalent to $t_o$ would be produced. While there are occasions with particular crystal vibrators where a single weight on each arm will accomplish that desired objective of correcting both frequencies to the proper conditions simultaneously, it is more common that several steps will be needed to accomplish the frequency adjustment if the proper characteristics of $\alpha$ and $\beta$ are to be achieved. Yet, because the variances in thickness which occur in manufacturing are so small as to approach zero, it is possible to shift the frequency to the desired frequency in flexure and torsion and still enable a substantial coincidence with the desired temperature characteristics of a vibrator having the most ideal cutting angle, thickness, and other dimensions. With reference to FIG. 35, which is similar to FIG. 30, the method by which the resonant frequencies are shifted from points C and D to points A and B, respectively, is described below.

Figure 42:
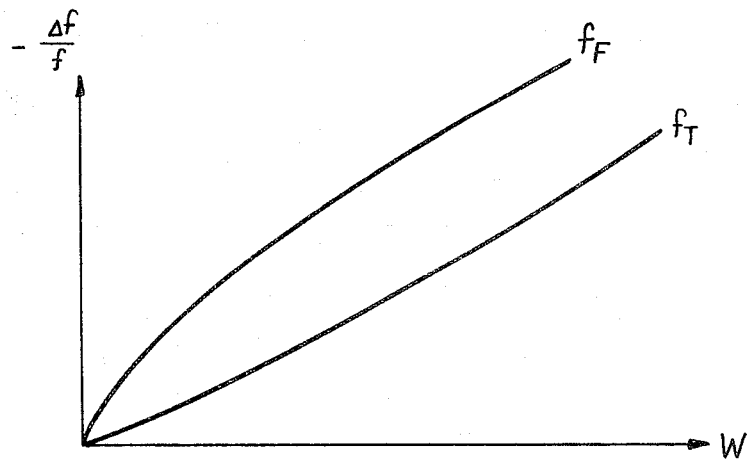
FIG. 42 is a graph illustrating the effect of added weight on the frequency characteristics of a tuning fork vibrator of this invention.

FIG. 42 shows the weight W of the mass 183 (FIG. 46) and the variation found in the resonant frequency of the first overtone of flexural vibration fF and in the resonant frequency fT of the fundamental vibration in torsion when a mass 183 is added to the free end of each vibrator tuning fork arm. Note that the ordinate scale in FIG. 42 is negative.

Figure 43:
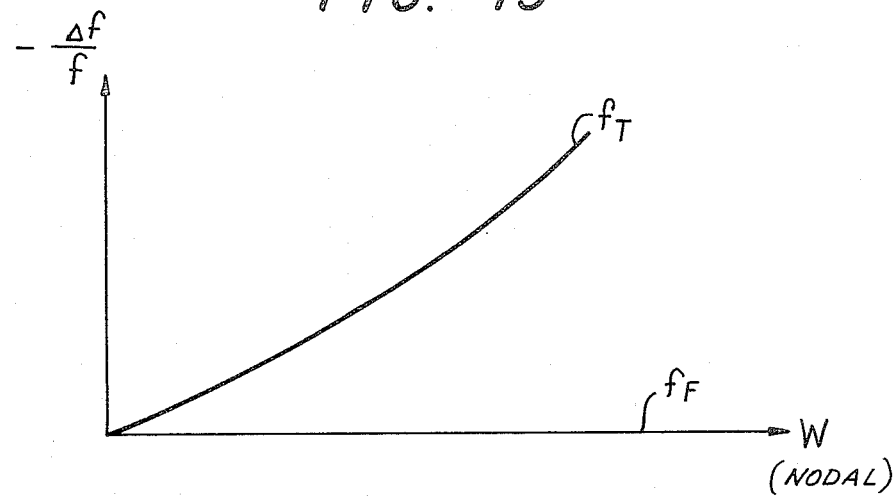
FIG. 43 is a graph illustrating another effect of the addition of weight to a tuning fork crystal vibrator of this invention.

In FIG. 43 is illustrated the variation in the resonant frequencies fT and fF when the mass 184 is added to a nodal point of the first overtone of the flexural vibration of the vibrator 180. When the mass is added to the free end of the tuning fork, both resonant frequencies fF and fT are decreased, but when the mass is added at a position corresponding to the nodal point of the first overtone of flexural vibration, the torsional resonant frequency fT is decreased, but the overtone resonant frequency in flexure is barely varied because the mass is not effective when placed at the nodal point of that vibration.

Figure 44:
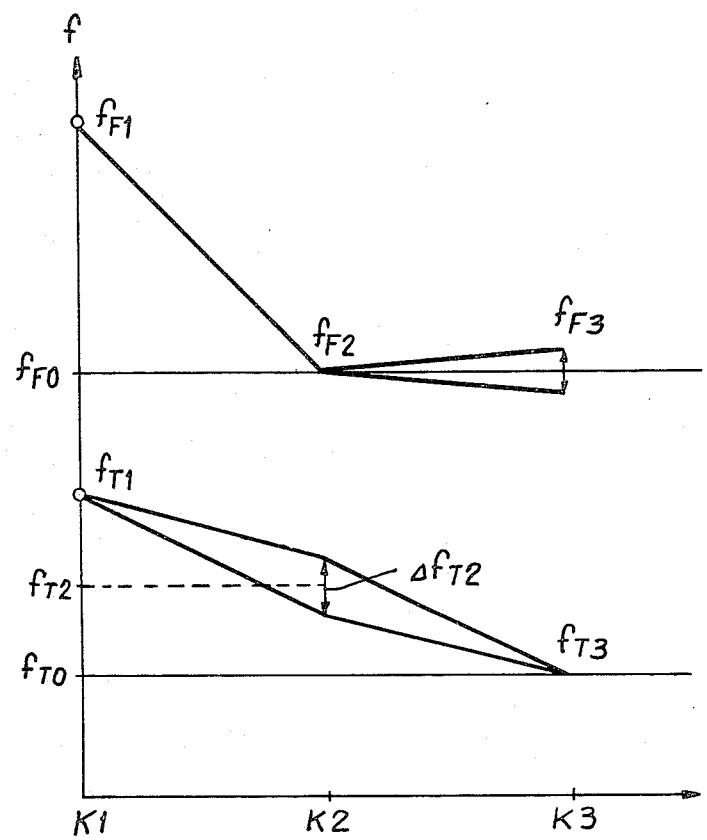
FIG. 44 is a graph illustrating a multi-step sequential process of adjusting frequency by the addition of weight to a tuning fork crystal vibrator of this invention.

FIG. 44 graphically illustrates steps to be followed in adjusting the frequency of a (FIG. 46) tuning fork vibrator of this invention which, because of manufacturing variances, does not have the desired nominal operating frequency or temperature characteristic at that frequency. The letter K is used to indicate steps in the procedure of adjustment, and $K_1$ is the condition of the vibrator prior to any adjustment. On the ordinate axis, $f_{FO}$ is the desired flexural overtone frequency, and $f_{TO}$ is the desired fundamental torsional frequency. Because of manufacturing variances, the vibrator at $K_1$ prior to any adjustments, has an overtone frequency in flexure of $f_{F1}$ and a fundamental torsional frequency of $f_{T1}$. The physical displacements in the vibrator are similar to those illustrated in FIG. 36 for an overtone frequency in flexure and a fundamental torsional frequency. The first adjustment $K_2$ is made by adding weights 183 to the free ends of the tuning fork. Weight is added such that the overtone flexural frequency drops from the value $f_{F1}$ to the value $f_{F2}$, which substantially equals the desired frequency $f_{FO}$. Because weight has been added to the free end of the tuning fork where there is also a torsional displacement $\tau'$, the torsional frequency is also diminished from $f_{T1}$ to $f_{T2} \pm \Delta f_{T2}/2$.

In the next adjustment, $K_3$, the mass 184 is positioned at a nodal point of the first overtone of flexural vibration of the tuning fork vibrator 180. This affects the torsional mode of vibration but has very little effect on the overtone mode of flexural vibration as discussed above. By the performance of the step $K_3$, the torsional vibrational frequency is reduced from the value $f_{T2}$ to the value $f_{T3}$, which corresponds to the desired torsional resonant frequency $f_{TO}$. However, in the process, there is still some modification to the flexural overtone frequency, which then may deviate in a narrow range about the desired overtone flexural frequency. These adjustments will be performed for the nominal design temperature, and because the thickness is very close to the ideal thickness $t_o$ and the cutting angle is very close to the desirable cutting angle $\phi_o$, there is substantial coincidence between the temperature characteristics of the adjusted vibrator with those of a vibrator which has been ideally cut to have the desired flexural overtone frequency and desired torsional frequency without adjustment. Thus, after only two steps of adjustment, the vibrator has resonant frequencies very close to the desired resonant frequencies and a favorable temperature-frequency characteristic. $\Delta$ in FIG. 44 indicates a dispersion in the frequency after adjustment. It should be understood that whenever the word "weight" or "mass" is used it is also intended to include the plural in so far as both arms of the tuning fork are similarly treated when frequencies are adjusted.

Adjustments have been satisfactorily accomplished from the following conditions for coupled modes.

FROM: $\dfrac{fF_1 - fF_o}{fF_o} \leq 6000$ ppm   K1

$\dfrac{fT_1 - fT_o}{fT_o} \leq 10000$ ppm   K1

TO: $\dfrac{fT_2 - fT_o}{fT_o} \leq 2000$ ppm   K2

The above numerical values indicate the effect produced by adding a weight at the free end of the tuning fork arms in the first adjustment step $K_2$. Then in the next step $K_3$, the mass 184 is added to the nodal point of the first overtone of the flexural vibration while the resonance frequency of the fundamental wave of torsional vibration is being measured. The resonance frequency of the fundamental wave of the torsional vibration is set to the value of $f_{TO}$. The following value is obtained which illustrates the relatively minor effect on flexural vibration when the weight is added at a node.

$$\left| \dfrac{fF_3 - fF_2}{fT_3 - fT_2} \right| \leq 0.005$$

After the final adjustment of frequency to step $K_3$ is completed, the overtone of flexural frequency $fF_3$ is equal to or less than 10 parts per million from the desired frequency $f_{F0}$. To improve the accuracy still further, the values of $f_{F3}$ is set at steps $K_2$ and $K_3$ little above the desired value of $f_{F0}$, and the entire procedure is repeated.

The procedure has been described in reference to the first overtone of the flexural vibration in which there is a vibrational nodal point in flexure, but it should be apparent that any flexural vibrations having one or more nodal points can be adjusted by the method described above. Thus, higher-order overtones of the flexural vibration as well as overtones of torsional vibration are subject to adjustment by these techniques.

When working with a vibration having one or more nodal points, that vibration may be considered as the equivalent of $f_F$ in FIG. 44. This is considered to be the major vibration. It is possible to adjust each of the resonant frequencies just as described above by setting the frequency of the sub-vibration, that is, $fT$, to the desired value after setting the frequency of the major vibration to the desired value. If a sub-vibration, for example, the torsional vibrations which have been discussed above, has one or more vibration nodal points, it may be considered as the major vibration in FIG. 44, which is adjusted in the first step to the desired value, and then the other frequency is adjusted to the desired value in the second step.

Although the discussion above has been primarily concerned with the addition of weight to the vibrators, the same concepts may be applied for adjusting the frequency by using a laser beam as disclosed in the Japanese utility model publication No. 6154/1977, where the laser beam is used to adjust the frequency by the removal of surplus weight which has been deposited in advance on the arms of the tuning fork vibrator. Whereas weight additions as described above operated to decrease frequencies, the negative addition, that is, removal of weight operates to increase the frequencies.

It will thus be seen that the objects set forth above, among those made apparent from the preceding description, are efficiently attained and, since certain changes may be made in carrying out the above process, in the described product, and in the constructions set forth without departing from the spirit and scope of the invention, it is intended that all matter contain in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A quartz tuning fork vibrator for a timekeeping device, said vibrator having at least two modes of vibration, said vibrator comprising quartz crystal formed in the shape of a tuning fork, said tuning fork including a base portion and arms extending therefrom, at least said arms having electrodes formed thereon, said quartz crystal having electrical X, mechanical Y, and optical Z axes, and said vibrator formed by cutting said quartz crystal at a selected cutting angle relative to said axes to form a quartz crystal plate, said quartz crystal plate having a selected thickness whereby the frequency difference between the first and second modes of vibration is no greater than 15% of said first mode of vibration, whereby a favorable frequency-temperature characteristic is provided.

2. A quartz crystal tuning fork vibrator as claimed in claim 1 wherein said two modes of vibration are the flexural fundamental frequency and the torsional fundamental frequency of vibration.

3. A quartz crystal tuning fork vibrator as claimed in claim 1 wherein said two modes of vibration are a flexural overtone frequency and the torsional fundamental frequency of vibration.

4. A quartz crystal tuning fork vibrator as claimed in claims 2 or 3 wherein said quartz crystal is cut zyw 0° to $-15°$.

5. A quartz crystal tuning fork vibrator as claimed in claims 2 or 3 wherein said quartz crystal is cut zyw 10° to 35°.

6. A quartz crystal tuning fork vibrator as claimed in claims 2 or 3 wherein said quartz crystal is cut zyl 25° to 55°.

7. A quartz crystal tuning fork vibrator as claimed in claims 2 or 3 wherein said quartz crystal is cut zyl $-25°$ to $-55°$.

8. A quartz crystal tuning fork vibrator as claimed in claims 1, 2, or 3 wherein said timekeeping device comprises timekeeping circuitry and time display means driven by said timekeeping circuitry, said timekeeping circuitry including an oscillator circuit, said oscillator circuit being coupled to said vibrator to effect an outputting of a time-reference signal at the frequency of the flexural mode of vibrator vibration.

9. A quartz crystal tuning fork vibrator as claimed in claims 1, 2 or 3 wherein said frequency-temperature characteristic is cubic in contour.

10. A quartz crystal tuning fork vibrator as claimed in claim 2 wherein said thickness is in the range of 80 to 100 microns, and said cutting angle zyw 0 to $-15$ degrees whereby a fundamental flexural frequency in the order of 100 KHZ is produced.

11. A quartz crystal tuning fork vibrator as claimed in claim 2, wherein said thickness is 88.5 microns, said cutting angle is zyw $-11°$ rotated about the electrical X axis, and the length of the tuning fork arms is 1670 microns, whereby a fundamental flexural frequency in the order of 100 KHZ is produced.

12. A quartz crystal tuning fork vibrator as claimed in claim 2 wherein said thickness is in the range of 50 to 150 microns, the width of said vibrator is in the range of 1.0 to 1.5 mm, and the length of said vibrator is in the range of 3 to 4 mm, and the crystal is cut zyw 0° to $-15°$, whereby a flexural frequency in the range of 100 KHZ is provided.

13. A quartz crystal tuning fork vibrator as claimed in claim 3, wherein said cutting angle is approximately zyw $-10°$ and crystal thickness is in the range of 130 to 180 microns, whereby a flexural overtone frequency of approximately 200 KHZ is provided.

14. A quartz crystal tuning fork vibrator as claimed in claim 3 wherein said thickness is in the range of 130 to 180 microns, the width of said vibrator is in the range of 0.8 to 1.0 mm, the length of said vibrator is in the range of 4 to 5 mm, and the crystal is cut zyw 0° to $-15°$, whereby a flexural overtone frequency in the range 150 to 200 KHZ is provided.

15. A quartz crystal tuning fork vibrator having a first resonant frequency of vibration which changes with changes in ambient temperature, the relationship between said first resonant frequency and said temperature being approximated mathematically by a Taylor's expansion having a first order term with the coefficient $\alpha$, a second order term with the coefficient $\beta$, and a third order term with the coefficient $\gamma$, and said vibrator having at least a second frequency of vibration, and the frequency difference between said first resonant frequency and said second frequency of vibration is no greater than 15% of said first resonant frequency of vibration, said vibrator being produced from quartz crystal having an electrical X axis, a mechanical Y axis and an optical Z axis, said crystal vibrator being cut at a selected angle and a selected thickness such that said first coefficient $\alpha$ and second coefficient $\beta$ are approximately 0, whereby said frequency-temperature relationship has a cubic characteristic and said changes in resonant frequency with said changes in temperature are minimized over the working range of said vibrator.

16. A quartz crystal tuning fork vibrator as claimed in claim 15 wherein said first resonant frequency is a flexural vibration and said second frequency is a torsional vibration.

17. A quartz crystal tuning fork vibrator as claimed in claim 16 wherein both said flexural vibration and said torsional vibration are fundamental frequency vibrations.

18. A quartz crystal tuning fork vibrator as claimed in claim 16 wherein said flexural vibration is an overtone vibration and said torsional vibration is a fundamental frequency.

19. A quartz crystal tuning fork vibrator as claimed in claims 17 or 18 wherein said flexural frequency demonstrates said cubic characteristic relative to said temperature changes.

20. A quartz crystal tuning fork vibrator as claimed in claim 15, wherein said cutting angle is selected from one of the angles in the range of zyw 0° to −15° and zyw 10° to 35°.

21. A quartz crystal tuning fork vibrator as claimed in claim 15, wherein said cutting angle is selected from one of the angles in the range of zyl 25° to 55° and the range of zyl −25° to −55°.

22. A quartz crystal tuning fork vibrator as claimed in claim 20 wherein said thickness is selected from one of the thicknesses in the range of 80 to 100 microns whereby said flexural frequency is approximately 100 KHZ.

23. A quartz crystal tuning fork vibrator as claimed in claim 22 wherein said flexural vibration is a fundamental frequency.

24. A quartz crystal tuning fork vibrator as claimed in claim 20 wherein said thickness is selected from one of the thicknesses in the range of 130 to 180 microns whereby said flexural frequency is approximately 200 KHZ.

25. A quartz crystal tuning fork vibrator as claimed in claim 24 wherein said flexural frequency is an overtone frequency of vibration.

26. A coupled tuning fork vibrator, said vibrator vibrating in first and second coupled modes, at least said first mode of vibration having a resonant frequency which changes with variations in ambient temperature, comprising: weight adjusting means located at selected portions of said tuning fork vibrator, the locations of said weight adjusting means being selected to adjust the frequencies of said coupled modes of vibration to differ by not more than 15% of the frequency of the first mode of vibration, the frequency temperature characteristics and resonant frequency of at least said first mode of vibration are modified.

27. A coupled tuning fork vibrator as claimed in claim 26 wherein said first mode of vibration is a flexural mode of vibration and said second mode of vibration is a torsional mode of vibration.

28. A coupled tuning fork vibrator as claimed in claim 27 wherein said flexural mode of vibration has at least one nodal point of displacement and said weight adjusting means are located at said at least one nodal point, modifying said torsional frequency, whereby said torsional resonant frequency is adjusted to said nominal value to correct for manufacturing variances.

29. A coupled tuning fork vibrator as claimed in claim 27 wherein said weight adjusting means are located at a non-nodal point, modifying both said flexural and torsional frequencies, whereby adjustment is made for manufacturing variances.

30. A coupled tuning fork vibrator as claimed in claim 27 wherein said weight adjusting means are located at both said at least one nodal point and at non-nodal points, whereby each mode of vibration is adjusted to a nominal resonant frequency, and a desirable temperature characteristic is restored despite manufacturing variances.

31. A coupled tuning fork vibrator as claimed in claim 27 wherein said vibrator is cut from quartz crystal at a selected angle and with selected thickness, said vibrator vibrates at the design temperature at a selected flexural resonant frequency and a selected torsional resonant frequency, and the frequency-temperature characteristic of flexural vibration in the design temperature range is cubic in contour.

32. A coupled tuning fork vibrator as claimed in claim 31 wherein said flexural vibration has at least one nodal point of displacement and said weight adjustment means are located at said at least one nodal point, modifying said torsional frequency, whereby said torsional frequency is adjusted to said selected torsional frequency.

33. A coupled tuning fork vibrator as claimed in claim 31 wherein said weight adjustment means are located at a non-nodal point, modifying both said flexural and torsional frequencies whereby the selected values of said frequencies are approached.

34. A coupled tuning fork vibrator as claimed in claim 31 wherein said weight adjustment means are located at both said at least one nodal point and at least one non-nodal point, whereby each said frequency is adjusted to its selected resonant frequency and said cubic temperature characteristic is restored.

35. A method for adjusting the vibrational rates of a tuning fork vibrator, said vibrator having first and second modes of vibration, said vibration mode differing in frequency and being coupled, at least said first vibration mode having at least one nodal point of vibrational displacement, comprising the steps of:
(a) modifying by one of addition and subtraction the quantity of weight present at non-nodal points on said vibrator, whereby the frequencies of both said modes are adjusted toward respective pre-selected values;
(b) modifying by one of addition and subtraction the quantity of weight present at said at least one nodal point, whereby said second mode of vibration more closely approaches said preselected value for said second mode of vibration, said modified vibrations not differing in frequency by more than 15% of said first mode frequency.

36. A method for vibration rate adjusting as claimed in claim 35, and comprising the additional steps of:
(c) repeating steps a and b consecutively until both said vibration modes have been adjusted substantially to said respective pre-selected vibration rates.

37. A method for vibration rate adjustment as claimed in claim 35 or 36, wherein addition of weight decreases said frequencies, and subtraction of weight increases said frequencies.

38. A method for vibration rate adjusting as claimed in claim 35 wherein said first mode of vibration is a flexural fundamental vibration, and said second mode of vibration is a torsional fundamental vibration, and in step a, weight is added to the free ends of the tuning fork arms, and in step b, weight is added at the base of said arms.

39. A method for vibration rate adjusting as claimed in claim 35 or 36 and comprising a step preceding the initial step a as follows:
fabricating said vibrator with a thickness a little greater than the nominal thickness for said tuning fork, and with a length a little less than the nominal length for said tuning fork,
whereby frequency adjustments for manufacturing variances require only weight additions.

40. A quartz crystal vibrator for a timekeeping device, said vibrator having at least two modes of vibration, said vibrator having electrodes formed on at least a portion thereof, said vibrator being produced from quartz crystal having electrical X, mechanical Y, and optical Z axes by cutting said quartz crystal at a selected cutting angle relative to said axes to form a quartz crystal plate, said quartz crystal plate having a selected thickness whereby the frequency difference between the first and second mode of vibration is no greater than 15% of said first mode of vibration, said first mode of vibration having a cubic frequency-temperature characteristic, whereby a stable frequency source is provided.

41. A quartz crystal vibrator as claimed in claim 40, wherein said cutting angle is selected from one of the angles in the range of zyw 10° to 35° and the range of zyw 0° to −15°.

42. A quartz crystal vibrator as claimed in claim 40 wherein said cutting angle is selected from one of the angles in the range of zyl 25° to 55° and the range of zyl −25° to −55°.

43. A method for producing a quartz crystal vibrator as claimed in claim 1, comprising the steps of:
(a) cutting a plate from quartz crystal;
(b) grinding said quartz crystal plate to a pre-selected thickness;
(c) coating the surfaces of said crystal plate with films of chromium and gold;
(d) applying a coating of photo-resist over said films;
(e) exposing said coating surfaces through a mask, said mask having the configuration of said vibrator printed thereon;
(f) removing with a solvent the unexposed photo-resist;
(g) dissolving the films of chromium and gold exposed by removal of said photo-resist in step (f);
(h) etching away the quartz crystal exposed in step (g).

44. A method as claimed in claim 43 wherein said etching of said crystal is accomplished using hydrofluoric acid.

45. A coupled tuning fork vibrator as claimed in claim 26 wherein said weight adjusting means comprises deformations in said tuning fork vibrator, each said deformation being the product of one of adding and removing of material from said tuning fork vibrator at said selected portions.

* * * * *